(12) United States Patent
Fowler

(10) Patent No.: US 6,265,867 B1
(45) Date of Patent: Jul. 24, 2001

(54) POSITION ENCODER UTILIZING FLUXGATE SENSORS

(75) Inventor: J. Thomas Fowler, Marblehead, MA (US)

(73) Assignee: Arthur D. Little, Inc., Cambridge, MA (US)

(*) Notice: Subject to any disclaimer, the term of this patent is extended or adjusted under 35 U.S.C. 154(b) by 0 days.

(21) Appl. No.: 09/315,205

(22) Filed: May 19, 1999

(51) Int. Cl.[7] .............................. G01B 7/30; G01B 7/14; G01P 3/487; G01P 15/00; G01L 3/00

(52) U.S. Cl. .................. 324/207.25; 324/162; 324/174; 324/207.12; 324/207.16; 324/207.24; 73/862.326

(58) Field of Search .......... 324/207.12, 207.15–207.19, 324/207.22–207.26, 160–163, 165, 173, 174, 247, 253–255; 240/870.31–870.33; 341/15; 73/514.39, 862.326, 862.331

(56) References Cited

U.S. PATENT DOCUMENTS

| | | | |
|---|---|---|---|
| 3,342,070 | * 9/1967 | Walch, Jr. | 324/174 X |
| 3,605,011 | 9/1971 | Hart et al. | 324/43 R |
| 3,644,825 | * 2/1972 | Davis, Jr. et al. | 324/207.26 |
| 3,824,456 | 7/1974 | Wiegand . | |
| 3,855,525 | * 12/1974 | Bernin | 324/173 X |
| 4,088,954 | 5/1978 | Fletcher et al. . | |
| 4,293,815 | 10/1981 | West et al. . | |
| 4,384,254 | 5/1983 | Brown . | |
| 4,673,827 | * 6/1987 | Sommer | 324/207.21 X |
| 4,717,873 | * 1/1988 | Carr, Jr. et al. | 324/207.16 |
| 4,719,419 | * 1/1988 | Dawley | 324/207.22 |
| 4,859,944 | 8/1989 | Webb . | |
| 5,115,197 | 5/1992 | Brandolino et al. . | |
| 5,124,648 | 6/1992 | Webb et al. . | |
| 5,170,566 | 12/1992 | Fowler et al. . | |
| 5,560,115 | 10/1996 | Fowler . | |
| 5,670,877 | 9/1997 | Scheiber . | |
| 5,742,160 | * 4/1998 | Bergstedt et al. | 324/207.25 |
| 5,744,950 | * 4/1998 | Seefeldt | 324/207.21 X |
| 5,895,854 | * 4/1999 | Becherer et al. | 324/174 X |

FOREIGN PATENT DOCUMENTS

WO 99/44072   9/1999 (WO) .

* cited by examiner

Primary Examiner—Gerard R. Strecker
(74) Attorney, Agent, or Firm—McDermott, Will & Emery

(57) ABSTRACT

An improved position encoder system for providing an output signal representative of the position of a movable body, relative to a reference position, includes at least one magnetic element fixedly attached to the movable body. The system further includes a first spatially orthogonal fluxgate sensor pair and a second spatially orthogonal fluxgate sensor pair for detecting the magnetic field. The first sensor pair is disposed adjacent to the polar axis at a first predetermined distance, and the second pair is disposed adjacent to the polar axis at a second predetermined distance, preferably twice the first predetermined distance. The system further includes a signal processor for receiving a signal from the first sensor pair and a signal from the second sensor pair. The signal processor produces an output signal that corresponds to a predetermined combination of the signal from the first sensor pair and the signal from the second pair, such that a resulting relationship between the output signal and the position of the movable body is substantially linear. Motion of the movable body may be rotational or linear, such that the encoded position is angular or linear. Proper placement of the sensors along the magnetic element of a linear position encoder enables a range of motion significantly beyond the total length of the magnetic element. Eccentric placement of the magnetic element on a rotatably movable body provides a substantially linear position-to-output signal relationship with relatively little processing of the resulting sensor signals.

31 Claims, 14 Drawing Sheets

POSITION ENCODER UTILIZING FLUXGATE SENSORS

CROSS-REFERENCE TO RELATED APPLICATIONS

This application is related to the following U.S. application filed contemporaneously herewith, of common assignee, the contents of which are incorporated herein in their entirety by reference:

"Low Power Fluxgate Circuit With Current Balance," invented by J. Thomas Fowler, U.S. application Ser. No. 09/314,322.

STATEMENT REGARDING FEDERALLY SPONSORED RESEARCH

Not Applicable.

REFERENCE TO MICROFICHE APPENDIX

Not Applicable

FIELD OF THE INVENTION

The present invention relates to position encoders, and more particularly to position encoders that utilize fluxgate sensors to produce an output signal that is a linear function of the position of a movable object with respect to a fixed reference.

BACKGROUND OF THE INVENTION

In general, position encoders are devices which determine the instantaneous physical position of a movable object with respect to a fixed reference point, and translate such position information into a form that can be utilized by a processing tool. A position encoder typically transforms position information into an electrical signal, and provides the electrical signal to an analog or digital signal processor. Position encoders may determine angular position, as in the case of a rotatable shaft or toroidal structure, or they may determine linear position, as in the case of a slidable control actuator. An ideal position encoder produces an output signal that is a linear function of the position of the movable object. Instantaneous position information, sampled over time, may be used to determine higher derivatives of position such as velocity and acceleration.

Typical position encoders operate either mechanically, electrically (e.g., capacitive sensors), optically or magnetically. A mechanical encoder relies upon physical contact with the movable object; actuators on the movable object physically interact with an electromechanical transducer to produce an electrical signal. An optical encoder receives light reflected from illuminated markings associated with the movable object and translates variations in the received light into an electrical signal. A magnetic encoder typically utilizes either fluxgate sensors, magneto-resistive sensors, giant magneto-resistive sensors, or Hall effect sensors. A fluxgate sensor magnetic encoder uses fluxgate sensors to detect the magnetic field generated by magnetic elements attached to the movable object, and translates aspects of the magnetic field such as magnitude and polarity into an electrical signal corresponding to the position and direction of motion of the object. A Hall effect sensor magnetic encoder translates the Hall effect of a magnetic field on a current carrying conductor to produce a signal corresponding to the position of the object. Fluxgate position encoders are several orders of magnitude more sensitive than Hall effect position encoders and are thus preferred in applications where it may be difficult to have the sensors in close proximity of the magnetic element producing the magnetic field. For example, in an application to determine the angular position of an automobile tire incorporating a magnetic element, the close proximity that a Hall effect sensor requires is difficult to maintain because of the harsh environment created by road dirt, oil, grease, ice and snow, whereas a fluxgate sensor can operate at a distance of several inches.

A fluxgate sensor includes one or more turns of an electrical conductor wound about a core, which is disposed along a sensing axis. The core may be any magnetically saturating material, including highly permeable materials such as alloys of iron and nickel. Saturable alloys exhibiting high permeability and low coercive strength are preferred. An external driving circuit alternately drives the sensor into saturation in one polarity and then into the opposite polarity. An improved fluxgate driving circuit is described and claimed in my copending application, U.S. application Ser. No. 09/314,322, filed contemporaneously herewith, and assigned to the present assignee (Attorney Docket No. ADL-092). The external driving circuit drives current through the windings in one direction until the core saturates. Once the core saturates, the driving circuit reverses current in the windings until the core saturates in the opposite polarity. In the absence of an external magnetic field, the amount of time the driving circuit drives current in each direction is the same; i.e., the current waveform through the windings as a function of time is symmetrical. The presence of an external magnetic field "helps" (i.e., enhances) the saturation of the core in one polarity, while the external magnetic field impedes the saturation of the core in the opposite polarity. Thus, in the presence of an external magnetic field, the waveform of the current through the windings as a function of time is asymmetrical, since saturation occurs more quickly for the polarity of the saturation enhanced by the external field. The amount of asymmetry can be used to determine characteristics of the external magnetic field, such as magnitude and direction.

Because of the bipolar nature of the magnetic element, a fluxgate sensor having a fixed position and orientation at the perimeter of a rotating magnetic element produces a periodic sinusoidal output. Similarly, a fluxgate sensor having a fixed position and orientation alongside a magnetic element, movable along its polar axis, produces approximately one cycle of a sinusoid as the magnetic element moves from pole to pole past the fluxgate sensor. Prior art fluxgate position encoders map the resulting sinusoid from the fluxgate sensor to an output signal that is a linear function of the position of the magnetic element. Such mapping requires a significant amount of processing resources and is subject to error, since the resulting sinusoid is not a true closed-form sinusoid and the resulting sinusoid tends to change shape due to various factors such as temperature and shaft run-out (i.e., movement of the axis of rotation). As the sinusoid changes shape, the output of the mapping function will be less than linear and will introduce an error in the position representation. The mapping function may be designed to be adaptive so as to compensate for such variations, but an adaptive mapping function further increases the mapping complexity.

Since a sinusoid is substantially linear in the region of its zero crossings (i.e., where the sinusoid changes from positive to negative and vice versa), some prior art fluxgate position encoders utilize the fluxgate sensor output directly, and limit the range of motion of the magnetic element, so as to constrain the sensor output to the linear range. The limited range of motion is a significant disadvantage to this type of encoder. Further, even within the limited range of motion, the error (with respect to a true linear transfer function) increases as the motion of the magnetic element moves the output away from the sinusoid zero crossing.

A further disadvantage to prior art position encoders is a sensitivity to run-out. Run-out is defined as any movement of the movable object from its intended path of movement. For example, in a rotational position encoder, the movable object is typically a shaft that rotates about a rotational axis, such that the outer perimeter of the shaft maintains a circular envelope as the shaft rotates. As shaft bearings wear out over time, the rotation about the ideal rotational axis may become eccentric, such that the outer perimeter of the shaft traces an irregular envelope as the shaft rotates. This deviation from the ideal circular envelope is known in the art as run-out. For a linear position encoder, the movable object ideally moves along a linear axis. Run-out occurs when the motion of the movable object deviates from this linear axis of movement (e.g., side to side movement).

It is an object of this invention to provide a position encoder that substantially overcomes or reduces the aforementioned disadvantages while providing other advantages which will be evident hereinafter.

SUMMARY OF THE INVENTION

The present invention is a position encoder for providing an output signal representative of a position of a movable body, relative to a reference position. The system includes at least one magnetic element fixedly attached to the movable body, and having opposing magnetic poles disposed along a polar axis and producing a magnetic field. In some forms of the invention, the magnetic element and the movable body may be combined into a single, integrated unit. The system further includes a first spatially orthogonal fluxgate sensor pair and a second spatially orthogonal fluxgate sensor pair for detecting the magnetic field. The first sensor pair is disposed adjacent to the polar axis at a first predetermined distance, and the second pair is disposed adjacent to the polar axis at a second predetermined distance, e.g., twice the first predetermined distance. The system further includes a signal processor for receiving a signal from the first sensor pair and a signal from the second sensor pair. The signal processor produces an output signal, representative of the relative position of the movable body and a function of the signal from the first sensor pair and the signal from the second pair. In a preferred embodiment, the resulting relationship between the output signal and the position of the movable body is substantially linear.

In another embodiment, the output signal includes information representative of the relative angular position of the movable body, and the movable body includes a rotatable shaft having a rotational axis. The rotating magnetic element defines a mean plane of rotation substantially normal to the rotational axis.

In another embodiment, the first sensor pair and the second sensor pair each includes a radial sensor for sensing a radial component of the magnetic field, and a tangential sensor for sensing a tangential component of the magnetic field. Preferably, the radial sensor of the first sensor pair is electrically connected in series opposition with the radial sensor of the second sensor pair, so as to produce a radial component signal, and the tangential sensor of the first sensor pair is electrically connected in series opposition to the tangential sensor of the second sensor pair, so as to produce a tangential component signal.

In another rectilinear embodiment, all of the sensors are disposed along a sensor axis within the mean plane of rotation and normal to the rotational axis. The tangential sensor of the first sensor pair is disposed at a distance R1, the tangential sensor of the second sensor pair is disposed at a distance R2, the radial sensor of the first sensor pair is disposed at a distance of R3, and the radial sensor of the second sensor pair is disposed at a distance of R4. Preferably, the distances R1, R2, R3 and R4 are chosen such that a first ratio R3/R1 is substantially equal to $2^{1/3}$, a second ratio R4/R2 is substantially equal to $2^{1/3}$, a third ratio R2/R1 is substantially equal to 2, and a fourth ratio R4/R3 substantially equal to 2.

In another embodiment, the position of the movable body includes rectilinear position, and the movable body includes an elongated bar element disposed along an axis of motion parallel with the polar axis. The first and second fluxgate sensor pairs are fixed relative to the reference position. The first sensor pair and the second sensor pair preferably each includes a radial sensor for sensing a radial component of the magnetic field, and a tangential sensor for sensing a tangential component of the magnetic field. Preferably, the radial sensor of the first sensor pair is electrically connected in series opposition with the radial sensor of the second sensor pair, so as to produce a radial component signal, and the tangential sensor of the first sensor pair is electrically connected in series opposition to the tangential sensor of the second sensor pair, so as to produce a tangential component signal.

In another embodiment, all of the sensors are disposed along an axis substantially normal to the linear axis of motion, the tangential sensor of the first sensor pair is disposed at a distance R1, the tangential sensor of the second sensor pair is disposed at a distance R2, the radial sensor of the first sensor pair is disposed at a distance of R3, and the radial sensor of the second sensor pair is disposed at a distance of R4. The distances R1, R2, R3 and R4 are preferably chosen such that a first ratio R3/R1 is substantially equal to $2^{1/3}$, a second ratio R4/R2 is substantially equal to $2^{1/3}$, a third ratio R2/R1 is substantially equal to 2 and a fourth ratio R4/R3 substantially equal to 2.

In another embodiment of the invention, the system includes a plurality of magnetic elements, each having opposing magnetic poles disposed along a polar axis so as to define a polar orientation. Each of the magnetic elements produces a magnetic field, the elements are uniformly distributed about, and fixedly attached to, the movable body, such that adjacent magnetic elements alternate polar orientation. The system further includes a pair of fluxgate sensors substantially aligned with adjacent poles of two adjacent magnetic elements, and fixed with respect to the reference position. The system also includes a signal processor for receiving a first signal and a second signal from the pair of fluxgate sensors, the first signal representing the magnetic field from a first magnetic element of the two adjacent elements, the second signal representing the magnetic field from a second magnetic element of the two adjacent elements. The signal processor produces the output signal representative of the position of the movable body and a function of the first signal and the second signal.

In another embodiment of the invention, the system includes an elongated magnetic element having a length L and having opposing magnetic poles disposed along a polar axis. The system further includes a first fluxgate sensor and a second fluxgate sensor disposed along a first sensor axis extending from and substantially normal to the polar axis. The first sensor is disposed at a first predetermined distance R1 and the second sensor is disposed at a second predetermined distance R2. The system further includes a third fluxgate sensor and a fourth fluxgate sensor disposed along a second sensor axis extending from and substantially normal to the polar axis, and at a distance D from said first sensor axis, substantially one half of the magnet length L. The third sensor is disposed at said first predetermined distance R1 and a fourth sensor is disposed at a second predetermined distance R2. The system further includes a signal processor for receiving a plurality of signals from the first, second, third and fourth fluxgate sensors, and for producing the output signal representative of the position of the movable body as a function of the plurality of signals, wherein the range of motion of the movable body is substantially greater than the length L.

And in another embodiment, the system includes a magnetic element fixedly attached to a rotatably movable body, offset from the of rotation of the body such that the magnetic element rotates eccentrically with respect to the movable body. The system further includes a radial fluxgate sensor for detecting a radial component of the magnetic field. The radial sensor is disposed adjacent to the polar axis at a first predetermined distance. The system includes a tangential fluxgate sensor for detecting a tangential component of the magnetic field. The tangential sensor is disposed adjacent to the polar axis at a second predetermined distance. The system further includes a signal processor for receiving a signal from the radial sensor and a signal from the tangential sensor. The signal processor produces the output signal representative of the relative position of the movable body, and as a function of the at least one signal from the radial sensor and the at least one signal from the tangential sensor. Preferably, the resulting relationship between the output signal and the position of the movable body is substantially linear for a range of the angular position.

BRIEF DESCRIPTION OF THE DRAWINGS

The foregoing and other objects of this invention, the various features thereof, as well as the invention itself, may be more fully understood from the following description, when read together with the accompanying drawings in which.

DETAILED DESCRIPTION OF THE INVENTION

Figure 1:
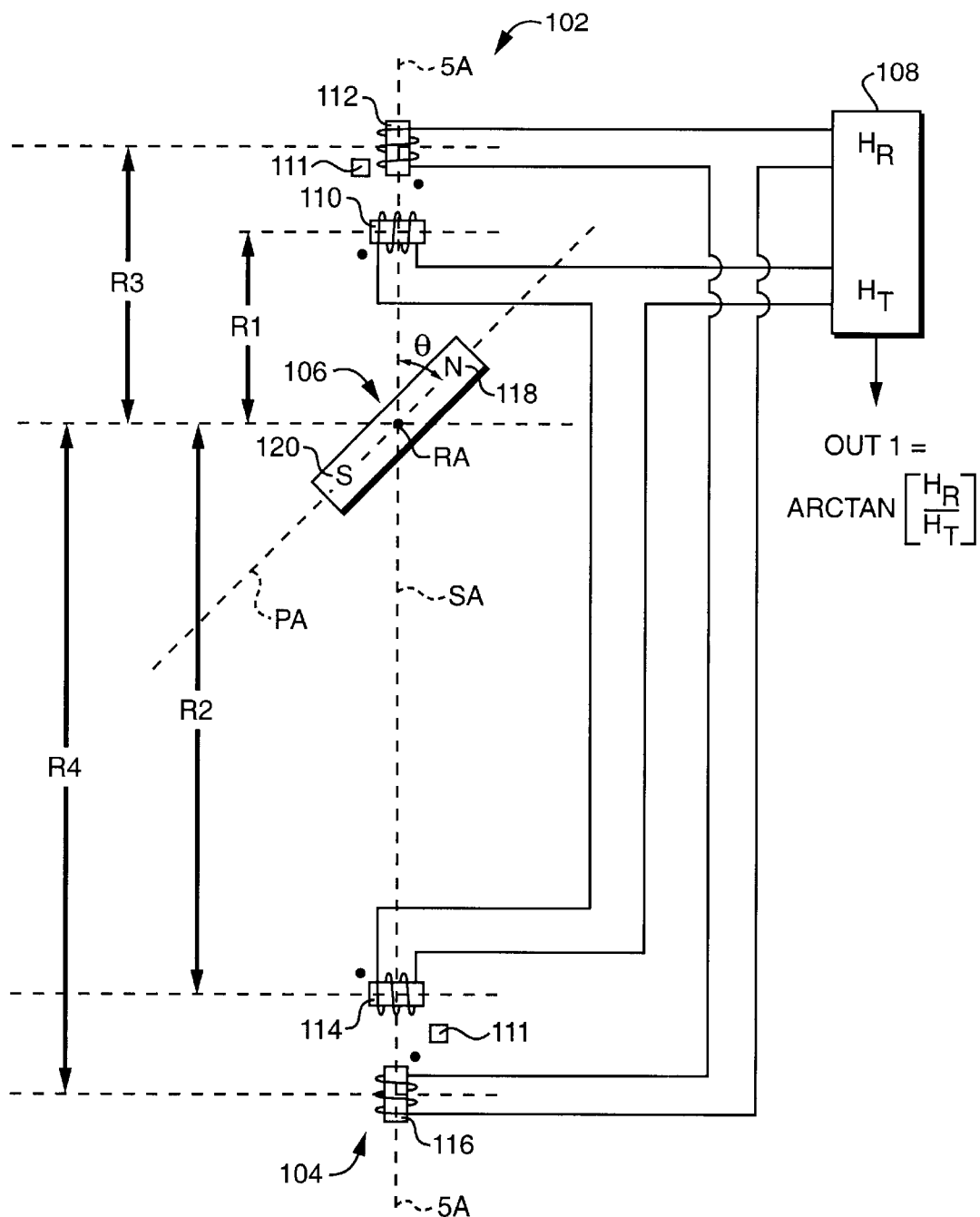
FIG. 1 illustrates a schematic view of one preferred embodiment of an improved position encoder.

The invention is directed to an improved position encoder for producing an electrical output signal that is preferably a linear function of the position of a movable object with respect to a fixed reference. FIG. 1 illustrates a schematic view of one preferred embodiment of an improved position encoder 100 according to the present invention, including a first spatially orthogonal fluxgate sensor pair 102, a second spatially orthogonal fluxgate sensor pair 104, a magnetic element 106 and a processor 108.

The first sensor pair 102 includes a first tangential sensor 110 and a first radial sensor 112. The second sensor pair 104 includes a second tangential sensor 114 and a second radial sensor 116.

The magnetic element 106 includes a north pole 118 and a south pole 120 disposed along a polar axis PA. The magnetic element 106 rotates about a rotational axis RA so as to define a mean plane of rotation. The rotational axis RA intersects the polar axis approximately midway between the north pole 118 and the south pole 120, and is substantially normal to the polar axis, PA.

The first tangential sensor 110, the first radial sensor 112, the second tangential sensor 114 and the second radial sensor 116 are disposed along a sensor axis SA that lies within the mean plane of rotation. The longitudinal centerline of the first tangential sensor 110 is preferably disposed along the sensor axis SA at a predetermined distance R1. The midpoint of the first radial sensor 112 is preferably disposed along the sensor axis SA at a predetermined distance R3. The midpoint of the second tangential sensor 114 is preferably disposed along the sensor axis SA at a predetermined distance R2. The midpoint of the second radial sensor 116 is disposed along the sensor axis SA at a predetermined distance R4. The first tangential sensor 110, which produces a first tangential output signal $H_{T1}$, and the second tangential sensor 114, which produces a second tangential output signal $H_{T2}$, are electrically connected in series opposition as shown in FIG. 1, so as to provide a composite tangential sensor output signal $H_T=H_{T1}-H_{T2}$ to the processor 108. The first radial sensor 112, which produces a first radial magnetic output signal $H_{R1}$ and the second radial sensor 116, which produces a second radial magnetic output signal $H_{R2}$, are electrically connected in series opposition as shown in FIG. 1, so as to provide a composite radial sensor output signal $H_R=H_{R1}-H_{R2}$ to the processor 108. Although signals are occasionally described herein as 'magnetic' signals, it should be noted that such signals are representative of magnetic field phenomena, and the signals themselves may be electrical, magnetic, or of other types known to those in the art. An homogenous magnetic field that is common to sensors connected in series opposition produces current components in the sensor windings having opposite polarities. These resulting current components cancel, thus sensors connected in series opposition (e.g., sensors 110, 114 and sensors 112, 116) tend to reject common, homogenous magnetic fields.

Rotation of the magnetic element 106 about the rotational axis RA defines a rotation angle θ from the polar axis PA to the sensor axis SA, as shown in FIG. 1. For a given distance from the rotational axis RA, the individual sensor output signals $H_{Tn}$ and $H_{Rn}$ (where n is either 1 or 2) are functions of θ, given by the following two equations:

$$H_{Rn} = k\cos(\theta) \qquad 1$$

$$H_{Tn} = \frac{1}{2}k\sin(\theta), \qquad 2$$

where k is a proportionality constant. For a fixed rotational angle θ, the sensor output signals $H_{Tn}$ and $H_{Rn}$ also vary as $R^{-3}$, where R is the distance from the rotational axis to the individual sensors. Since the magnitude of the radial sensor output signal is twice the magnitude of the tangential sensor output signal at a given distance R, it is possible to use the $R^{-3}$ variation and place the sensors of a radial/tangential sensor pair at different distances along the sensor axis, so as to produce equal radial and tangential signal amplitudes at a given rotational angle θ. As shown in FIG. 1, the first tangential sensor 110 is disposed along the sensor axis SA at a distance R1 from the rotational axis RA and the first radial sensor 112 is disposed along the sensor axis SA at a distance R3 from the rotational axis RA. The distances R1 and R3 are chosen such that the ratio of R3/R1 is preferably substantially equal to $2^{1/3}$. Similarly, the distances R2 and R4 are chosen such that the ratio of R4/R2 is preferably substantially equal to $2^{1/3}$. Because of the $R^{-3}$ variation in signal amplitude, such a placement results in equal radial and tangential signal amplitudes for a given rotational angle θ.

Since the tangential sensors 110 and 114 are electrically connected in series opposition and the radial sensors 112 and 116 are electrically connected in series opposition, the electrically connected pairs reject homogenous external magnetic fields common to both sensors (e.g., the earth's magnetic field). Consequently, if the electrically connected sensors (i.e., 110 and 114 or 112 and 116) are disposed along the sensor axis SA at the same distance from the rotational axis RA, the sensors will also reject the local field produced by the magnetic element 106. However, if the electrically connected sensors are disposed along the sensor axis SA at unequal distances from the rotational axis RA, the electrically connected sensors will together produce a net output equal to the difference between the magnetic field strength that each sensor detects, due to the $R^{-3}$ variation of the magnetic field strength as a function of distance from the magnetic element 106. For example, in the illustrated embodiment of the present invention shown in FIG. 1, if the ratio of R2/R1=2, the first tangential sensor output signal $H_{T1}$ will be 8 times greater than the second tangential sensor output signal $H_{T2}$, due to the $R^{-3}$ variation of magnetic field strength. Thus, the composite tangential sensor output signal $H_T$ will be ⅞ or 87.5% of the signal produced by the closer individual sensor (i.e., the first tangential sensor 110). Similarly, if the ratio of R4/R3=2, the first radial sensor output $H_{R1}$ will be 8 times greater than the second radial sensor output signal $H_{R2}$, and the composite radial sensor output $H_R$ will be ⅞ or 87.5% of the signal produced by the closer individual sensor (the first radial sensor 112).

The processor 108 receives the composite tangential sensor output signal $H_T$ composite radial sensor output signal $H_R$ and combines the two output signals to produce an output signal, OUT1, via the following algorithm:

$$OUT1 = \arctan\left[\frac{H_T}{H_R}\right]. \qquad 3$$

Although the sensor output signals $H_T$ and $H_R$ are substantially sinusoidal functions of rotational angle θ due to the bipolar nature of the magnetic element 106, the output signal OUT1 of the processor 108, defined by equation 3, is a substantially linear function of rotational angle θ. Because the output signal OUT1 is ratiometric (i.e., the output depends upon the ratio of the tangential and radial magnetic field magnitudes rather than their actual values), and the sensors providing input to the ratio are disposed along the same radius within the mean plane of rotation, the output OUT1 is substantially immune from error due to run-out. Run-out tends to produce small changes in the distances R1, R2, R3 and R4 on a percentage basis. Since the tangential/radial sensor pairs are situated relatively close to one another, slight changes in the distances R1, R2, R3 and R4 do not significantly affect the $H_T/H_R$ ratios of equation 3. Thus, normal shaft run-out does not significantly affect the linearity or accuracy of this embodiment of the invention.

Figure 2A:
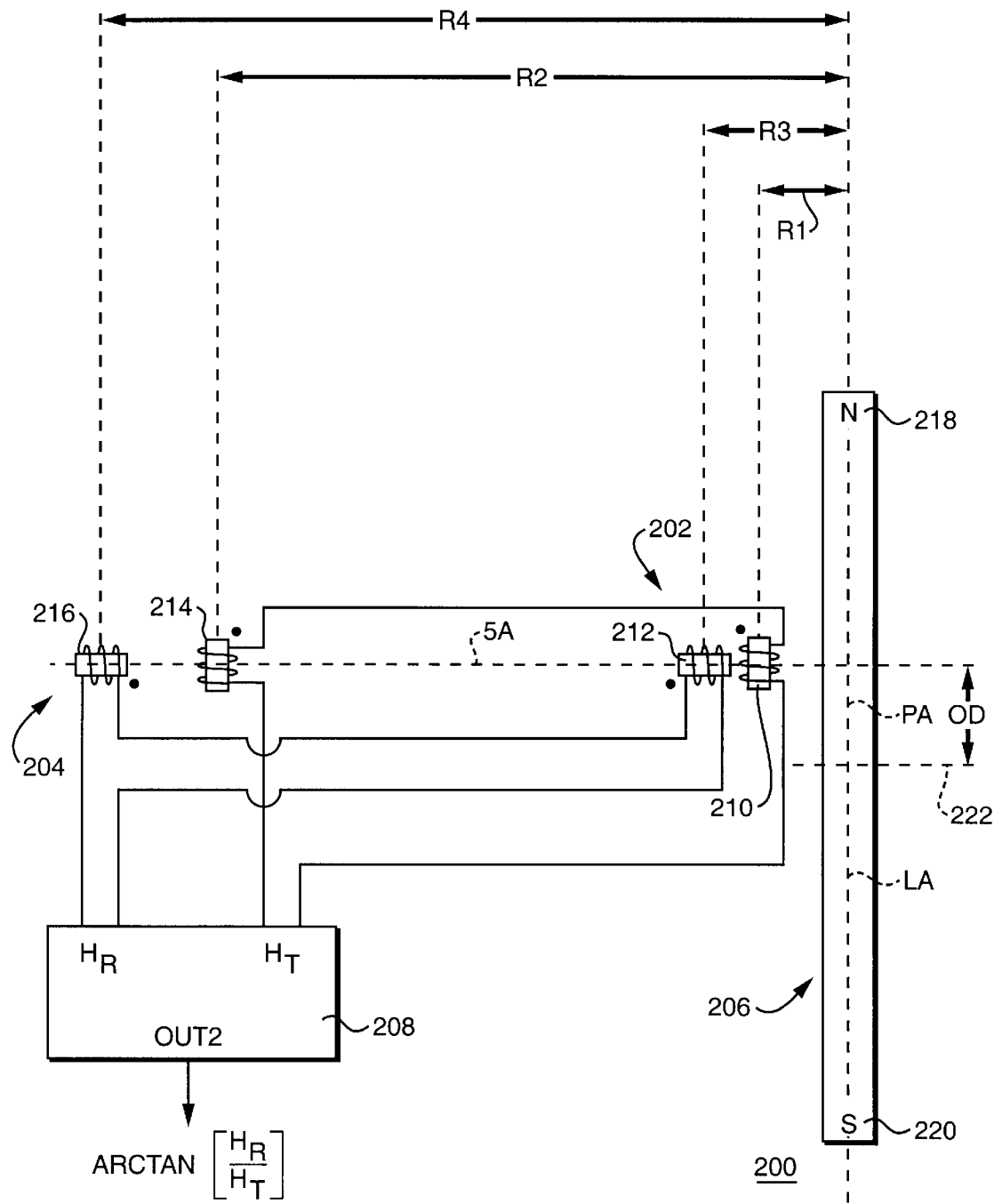
FIG. 2A illustrates a schematic view of another embodiment of the position encoder from FIG. 1.

FIG. 2A illustrates a schematic view of another embodiment of an improved position encoder 200 according to the present invention, including a first spatially orthogonal fluxgate sensor pair 202, a second spatially orthogonal fluxgate sensor pair 204, a magnetic element 206 and a processor 208.

The first sensor pair 202 includes a first tangential sensor 210 and a first radial sensor 212. The second sensor pair 204 includes a second tangential sensor 214 and a second radial sensor 216.

The magnetic element 206 includes a north pole 218 and a south pole 220 disposed along a polar axis PA. The magnetic element 206 travels along a linear axis LA which is substantially collinear with the polar axis PA. In other embodiments of the invention, the magnetic element 206 may be fixedly attached to a movable object (not shown).

The first tangential sensor 210, the first radial sensor 212, the second tangential sensor 214 and the second radial sensor 216 are disposed along a sensor axis SA that is substantially normal to the linear axis LA. The longitudinal centerline of the first tangential sensor 210 is preferably disposed along the sensor axis SA at a predetermined distance R1. The approximate midpoint of the first radial sensor 212 is preferably disposed along the sensor axis SA at a predetermined distance R3. The longitudinal centerline of the second tangential sensor 214 is preferably disposed along the sensor axis SA at a predetermined distance R2. The approximate midpoint of the second radial sensor 216 is disposed along the sensor axis SA at a predetermined distance R4. The first tangential sensor 210, which produces a first tangential output magnetic signal $H_{T1}$, and the second tangential sensor 214, which produces a second tangential output magnetic signal $H_{T2}$, are electrically connected in series opposition as shown in FIG. 2A, so as to provide a composite tangential sensor output magnetic signal $H_T = H_{T1} - H_{T2}$ to the processor 208. The first radial sensor 212, which produces a first radial output signal $H_{R1}$ and the second radial sensor 216, which produces a second radial output signal $H_{R2}$, are electrically connected in series opposition as shown in FIG. 2A, so as to provide a composite radial sensor output signal $H_R = H_{R1} - H_{R2}$ to the processor 208. An homogenous magnetic field that is common to sensors connected in series opposition produces current components in the sensor windings having opposite polarities. These resulting current components cancel, thus sensors (e.g., sensors 210, 214 and 212, 216) connected in series opposition tend to reject common, homogenous magnetic fields.

Movement of the magnetic element 206 along the linear axis LA defines an offset distance OD from the centerline 222 of the magnetic element 206 to the sensor axis SA, as shown in FIG. 2A. Similar to the embodiment described in FIG. 1, the individual sensor output signals $H_{Tn}$ and $H_{Rn}$ (n being 1 or 2) are quasi-sinusoidal functions of the offset distance OD. For a fixed offset distance OD, the sensor output signals $H_{Tn}$ and $H_{Rn}$ also vary as approximately $R^{-3}$, where R is the distance from the polar axis PA to the individual sensors. When the distance from the sensor to the polar axis is less than 2L (where L is the pole to pole length of the magnet 206), the variation may be more accurately represented as $R^{-2}$ or $R^{-1}$, depending on the actual distance. Since the magnitude of the radial sensor output signal is twice the magnitude of the tangential sensor output signal at a given distance R, it is possible to use the $R^{-3}$ variation and place the sensors of a radial/tangential sensor pair at different distances along the sensor axis, so as to produce equal signal magnitudes at a given offset distance OD. As shown in FIG. 2A, the first tangential sensor 210 is disposed along the sensor axis SA at a distance R1 from the polar axis PA and the first radial sensor 212 is disposed along the sensor axis SA at a distance R3 from the polar axis PA. The distances R1 and R3 are chosen such that the ratio of R3/R1 is substantially equal to $2^{1/3}$. Similarly, the distances R2 and R4 are chosen such that the ratio of R4/R2 is substantially equal to $2^{1/3}$. Because of the $R^{-3}$ variation in signal magnitude, such a placement results in equal radial and tangential signal magnitudes for a given offset distance OD.

Since the tangential sensors 210 and 214 are electrically connected in series opposition and the radial sensors 212 and 216 are electrically connected in series opposition, the electrically connected pairs reject homogeneous external magnetic fields common to both sensors (e.g., the earth's magnetic field). Consequently, if the electrically connected sensors (i.e., 210 and 214 or 212 and 216) are disposed along the sensor axis SA at the same distance from the polar axis PA, the sensors will also reject the local field produced by the magnetic element 206. However, if the electrically connected sensors are disposed along the sensor axis SA at unequal distances from the polar axis PA (or on opposite sides of the polar axis PA at equal distances from PA for radial component sensors), the electrically connected sensors will together produce a net output equal to the difference between the magnetic field strength that each sensor detects due to the approximate $R^{-3}$ variation of the magnetic field strength as a function of distance from the magnetic element 206. In the embodiment of the present invention shown in FIG. 2A, if the ratio of R2/R1=2, the first tangential sensor output magnetic signal $H_{T1}$ will be 8 times greater than the second tangential sensor output magnetic signal $H_{T2}$, due to the $R^{-3}$ variation of magnetic field strength. Thus, the composite tangential sensor output signal $H_T$ will be ⅞ or 87.5% of the signal produced by the closer individual sensor (i.e., the first tangential sensor 110). Similarly, if the ratio of R4/R3=2, the first radial sensor output $H_{R1}$ will be 8 times greater than the second radial sensor output signal $H_{R2}$, and the composite radial sensor output $H_R$ will be ⅞ or 87.5% of the signal produced by the closer individual sensor (the first radial sensor 112). Other ratios of R2/R1 and R4/R3 may be used to produce similar results.

The processor 208 receives the composite tangential sensor output signal $H_T$ composite radial sensor output signal $H_R$ and combines the two output signals to produce OUT2 via the following algorithm:

$$OUT2 = \arctan\left[\frac{H_T}{H_R}\right]. \quad 4$$

Although the sensor output signals $H_T$ and $H_R$ are quasi-sinusoidal functions of the offset distance OD due to the bipolar nature of the magnetic element 206, the output OUT2 of the processor 208, defined by equation 4, is a substantially linear function of the offset distance OD. Since the output is ratiometric, i.e., the output depends upon the ratio of the tangential and radial magnetic field magnitudes rather than their actual values, the output OUT2 is substantially immune from error due to run-out. Run-out tends to produce small changes in the distances R1, R2, R3 and R4 on a percentage basis. Since the tangential/radial sensor pairs are situated relatively close to one another, slight changes in the distances R2, R2, R3 and R4 do not significantly affect the $H_T/H_R$ ratios of equation 3. Thus, normal run-out of the magnetic element 206 away from the linear axis of motion does not significantly affect the linearity or accuracy of this embodiment of the invention.

Figure 2B:
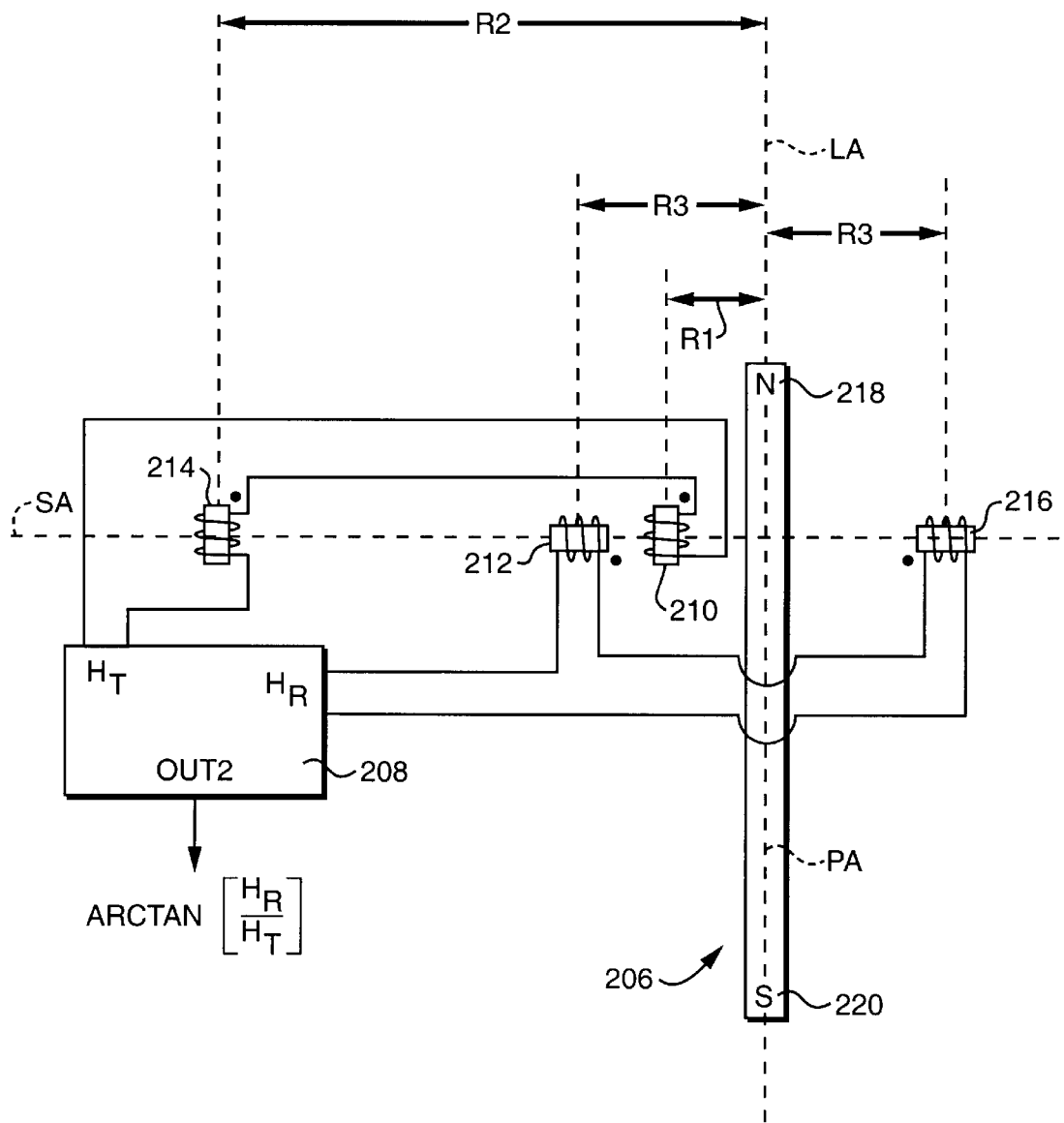
FIG. 2B illustrates a variation of the embodiment shown in FIG. 2A.

FIG. 2B illustrates a variation of the embodiment shown in FIG. 2A. In FIG. 2B, the radial sensors 212 and 216 are located on opposite sides of the magnetic element 206 at an equal distance R3. The radial components of the field on opposite sides of the magnetic element 206 are in opposite directions, so the sensors 212 and 216, when arranged in series opposition, will add the radial components of the magnetic element 206 equally while rejecting any magnetic fields common to both sensors.

Figure 3:
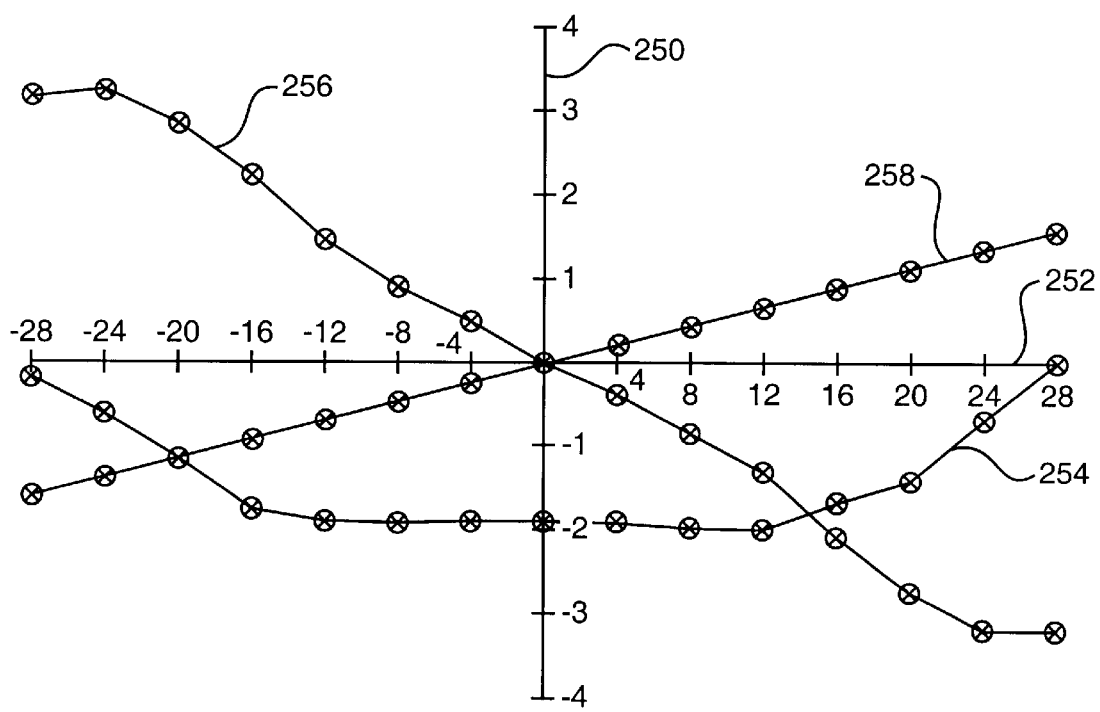
FIG. 3 graphically shows the linearization of the relationship between magnetic element motion and sensor output.

FIG. 3 shows, in graphical form, the extent to which the algorithm of equation 3 linearizes the relationship between motion of the magnetic element 206 and the sensor output. In FIG. 3, the vertical axis 250 represents the output of the sensor in Gauss multiplied by a factor of 10, and the horizontal axis 252 represents the position of the magnetic element 106 in millimeters, relative to the sensor axis SA. On the horizontal axis, zero represents the point at which the sensor axis SA intersects the polar axis PA midway between the north pole 218 and the south pole 220. The first curve 254 represents the composite tangential sensor output magnetic signal $H_T$, the second curve 256 represents the composite radial sensor output magnetic signal $H_R$, and the third curve 258 represents the output OUT2 of the processor 208. Although neither of the composite sensor output signals possess significant sinusoidal characteristics, the output OUT2 is substantially linear, with linearity errors of 0.46%, 1.08% and 1.37% at offset distances, OD, of +/−20 mm, +/−24 mm and +/−28 mm, respectively. This result occurs when R1 (the distance from the first tangential sensor 210 to the polar axis PA) is approximately 0.36% of the length of the magnetic element 206 from pole to pole. In the exemplary embodiment that produced the curves shown in FIG. 3, the length of the magnetic element 206 from pole to pole is 50 mm, and the distance R1 is 18 mm.

Figure 4:
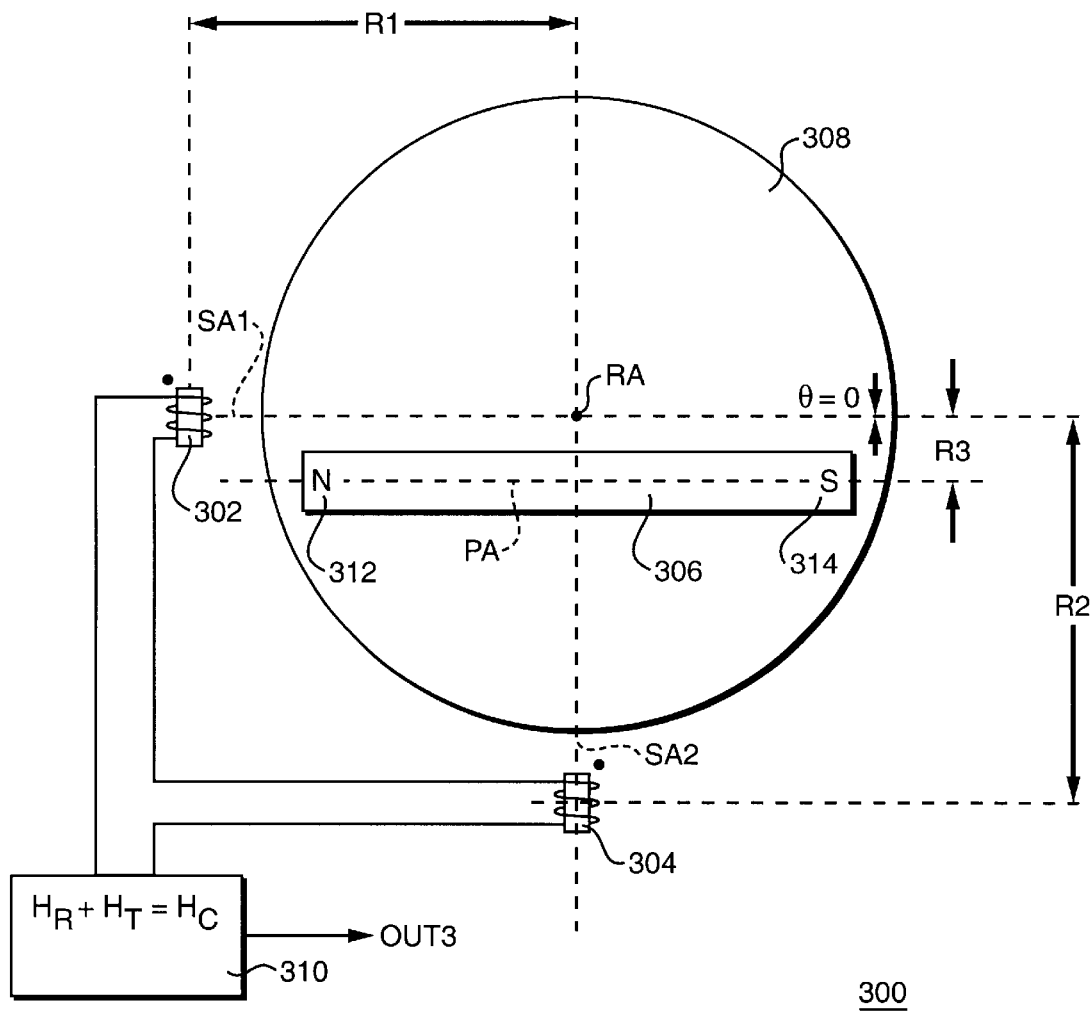
FIG. 4 schematically illustrates another embodiment of the position encoder from FIG. 1.

FIG. 4 schematically illustrates another embodiment of an improved position encoder 300 according to the present invention, including a first fluxgate sensor 302, a second fluxgate sensor 304, a magnetic element 306, a rotatably movable object 308 such as a cylindrical shaft and a processor 310. The magnetic element 306 includes a north pole 312 and a south pole 314 disposed along a polar axis PA. The rotatably movable object 308 rotates about a rotational axis RA so as to define a mean plane of rotation. The magnetic element 306 is fixedly attached to the rotatably movable object 308 within the mean plane of rotation, offset from the rotational axis RA such that the polar axis PA is parallel to a radial axis of the rotatably movable object 308 (i.e., an axis that passes through the rotational axis RA), and the distance from the rotational axis RA to the polar axis PA is a predetermined distance R3. The angular position of the rotatably movable object 308 is described by θ, an angle between a fixed reference such as the first sensor axis SA1 and a radius of the object 308. When the rotatable object 308 and the attached magnetic element 306 are in the position shown in FIG. 4, the angle θ=0.

The first sensor 302 is disposed along a first sensor axis SA1 that intersects the rotational axis RA. The distance from the first sensor 302 to the rotational axis RA is a predetermined distance R1. The second sensor 304 is disposed along a second sensor axis SA2 that intersects the rotational axis RA and is substantially normal to the first sensor axis SA1. The distance from the second sensor 304 to the rotational axis RA is a predetermined distance R2. The first sensor 302, which produces a tangential output signal $H_T$, and the second tangential sensor 304, which produces a radial output signal $H_R$, are electrically connected in series as shown in FIG. 4, so as to provide a composite sensor output signal $H_C = H_T + H_R$ to the processor 308.

Figure 5:
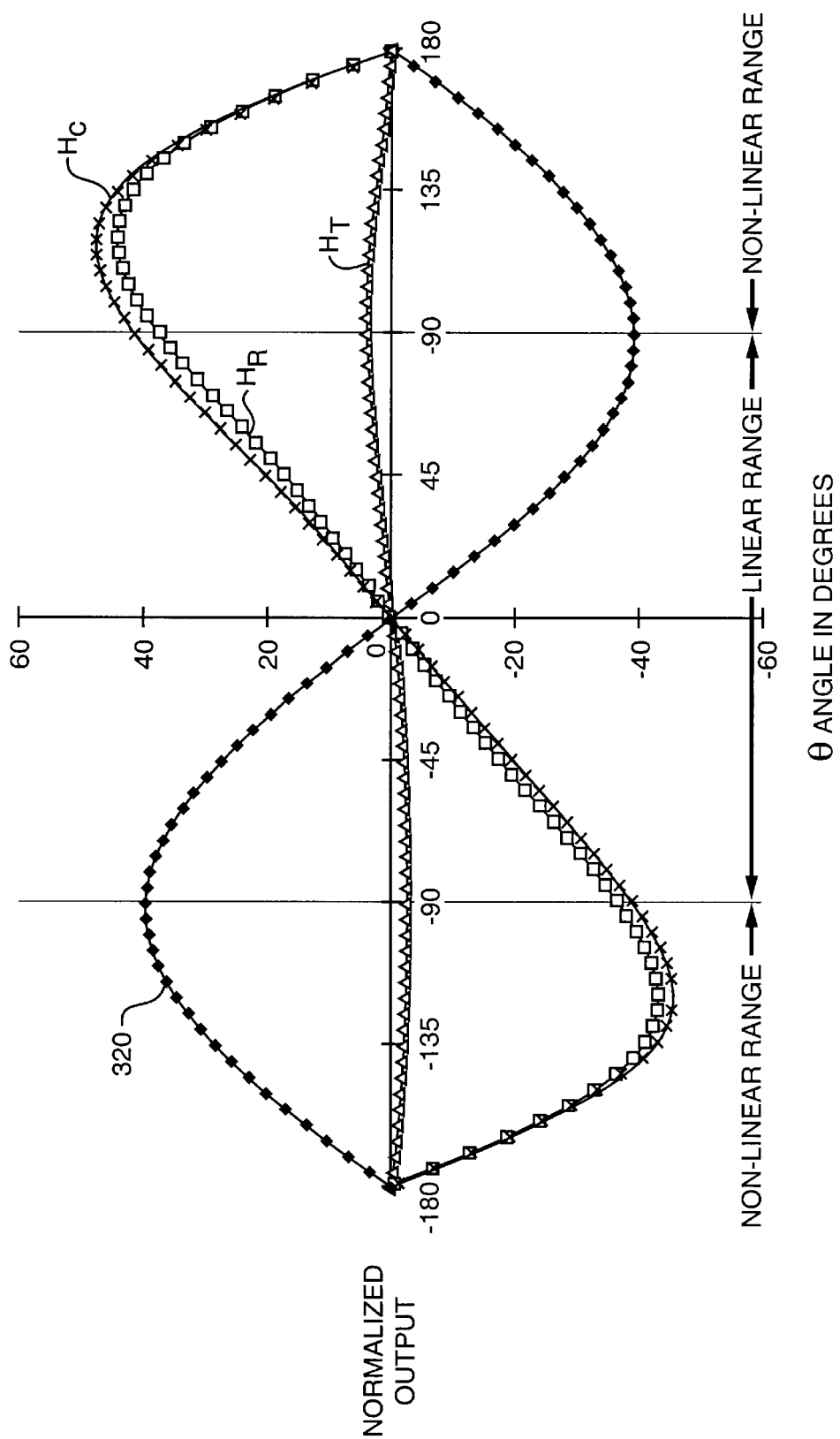
FIG. 5 graphically illustrates the fluxgate sensor outputs from the embodiment of FIG. 4, along with a composite signal and an ideal sinusoid.

FIG. 5 graphically illustrates the sensor outputs $H_T$ and $H_R$ along with the composite signal $H_C$ and an ideal sinusoid 320. The ideal sinusoid 320 is somewhat linear in the sign-transition region (θ=0), although the sinusoid becomes significantly non-linear as the angular position θ approaches +/−90 degrees. As the curves corresponding to $H_T$ and $H_R$ demonstrate, eccentrically offsetting the magnetic element 306 from the rotational axis RA significantly extends the linear region. As the curve $H_C$ demonstrates, summing the two sensor outputs extends the linear region even further, to approximately +/−90 degrees. The standard deviation of curve $H_C$ with respect to true linear is approximately 0.78%.

One aspect of the utility of the arrangement shown in FIG. 4 is that the processor 310 does not need to perform complex mapping functions, as long as the range of angular position θ is limited to 180 degrees or less. In such applications, the processor 310 may include only a simple buffer circuit to drive the output OUT3 and isolate the sensors 302 and 304 from an external device receiving the output OUT3.

Figure 6A:
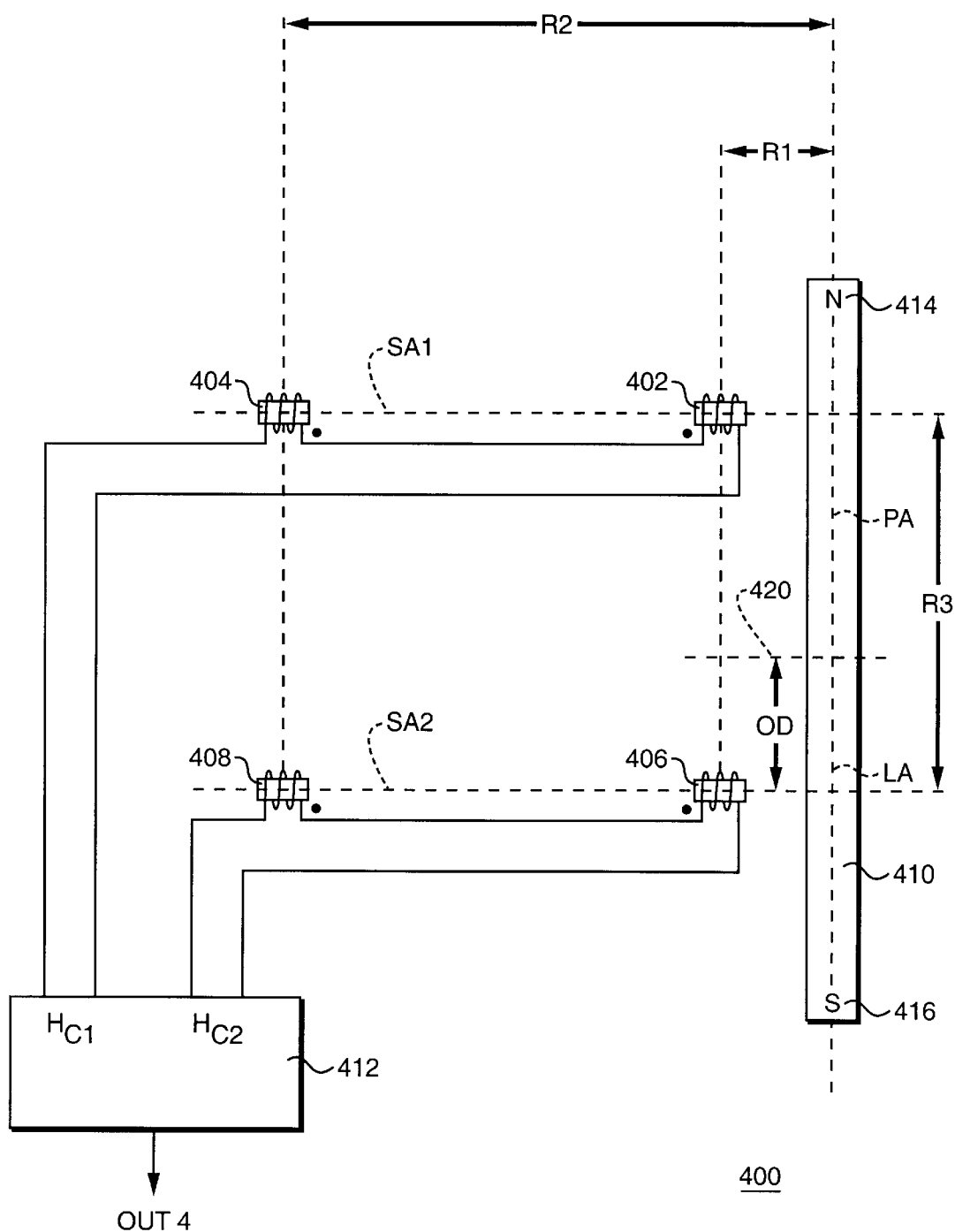
FIG. 6A illustrates a schematic view of another embodiment of the position encoder from FIG. 1.

FIG. 6A illustrates a schematic view of another embodiment of an improved position encoder 400 according to the present invention, including a first fluxgate sensor 402, a second fluxgate sensor 404, a third fluxgate sensor 406, a fourth fluxgate sensor 408, a magnetic element 410, and a processor 412. In the illustrated embodiment, the four sensors 402, 404, 406 and 408 are all oriented to detect magnetic field components in a direction substantially normal to the polar axis PA, although those skilled in the art will recognize that other orientations of the sensors will produce similar results. The magnetic element 410 includes a north pole 414 and a south pole 416 disposed along a polar axis PA. The magnetic element 410 travels along a linear axis LA which is substantially collinear with the polar axis PA. In other embodiments of the invention, the magnetic element may be fixedly attached to a movable object (not shown). The first sensor 402 and the second sensor 404 are disposed along a first sensor axis SA1, and the third sensor 406 and the fourth sensor 408 are disposed along a second sensor axis SA2. The sensor axes SA1 and SA2 are substantially normal to the linear axis LA, substantially parallel to one another, and separated by a distance R3, where R3 is substantially equal to one half of the pole-to-pole length of the magnetic element 410. The first sensor 402 and the third sensor 406 are disposed along the first sensor axis SA1 and the second sensor axis SA2, respectively, at a predetermined distance R1. The second sensor 404 and the fourth sensor 408 are disposed along the first sensor axis SA1 and the second sensor axis SA2, respectively, at a predetermined distance R2. The first sensor 402, which produces a first radial output signal $H_{R1}$, and the second sensor 404, which produces a second radial output signal $H_{R2}$, are electrically connected in series opposition as shown in FIG. 6A, so as to provide a first composite sensor output signal $H_{C1}=H_{R1}-H_{R2}$ to the processor 412. The third sensor 406, which produces a third radial output signal $H_{R3}$ and the fourth sensor 408, which produces a fourth radial output signal $H_{R4}$, are electrically connected in series opposition as shown in FIG. 6A, so as to provide a second composite radial sensor output signal $H_{C2}=R_{R3}-HR_{R4}$ to the processor 412. A homogenous magnetic field that is common to sensors connected in series opposition produces current components in the sensor windings having opposite polarities. These resulting current components cancel, thus sensors connected in series opposition tend to reject common, homogenous magnetic fields.

Movement of the magnetic element 410 along the linear axis defines an offset distance OD from the centerline of the magnetic element 420 to the sensor axis SA, as shown in FIG. 6A. Similar to the embodiment described in FIG. 2, the individual sensor output signals $H_{Rn}$ (n being 1, 2, 3 or 4) are quasi-sinusoidal functions of the offset distance OD. Since the first and second sensors 402 and 404 are electrically connected in series opposition and the third and fourth sensors 406 and 408 are electrically connected in series opposition, the electrically connected pairs reject homogenous external magnetic fields common to both sensors (e.g., the earth's magnetic field). Consequently, if the electrically connected sensors 402 and 404 or 406 and 408 are disposed along their respective sensor axes SA1 or SA2, respectively, at the same distance from the polar axis PA, the sensors will also reject the local field produced by the magnetic element 410. However, if the electrically connected sensors are disposed along their respective sensor axes at unequal distances from the polar axis PA, the electrically connected sensors will together produce a net output equal to the difference between the magnetic field strength that each sensor detects due to the $R^{-3}$ variation of the magnetic field strength as a function of distance from the magnetic element 410. In the embodiment of the present invention shown in FIG. 6A, if the ratio of R2/R1=2, the first sensor output signal $H_{R1}$ will be 8 times greater than the second sensor output signal $H_{R2}$, due to the $R^{-3}$ variation of magnetic field strength. Thus, the first composite sensor output signal $H_{C1}$ will be ⅞ or 87.5% of the signal produced by the closer individual sensor (i.e., the first sensor 402). Similarly, if the ratio of R4/R3=2, the third sensor output $H_{R3}$ will be 8 times greater than the fourth sensor output signal $H_{R4}$, and the second composite sensor output $H_{C2}$ will be ⅞ or 87.5% of the signal produced by the closer individual sensor (the third sensor 406). Other ratios of R2/R1 and R4/R3 may be used to produce similar results.

The processor 412 receives the first composite sensor output signal $H_{C1}$ and the second composite sensor output signal $H_{C2}$ and combines the two output signals to produce the output signal OUT4 via the following algorithm:

$$OUT4 = \arctan\left[\frac{H_{C1}}{H_{C2}}\right]. \qquad 5$$

Although the sensor output signals $H_{C1}$ and $H_{C2}$ are quasi-sinusoidal functions of the offset distance OD due to the bipolar nature of the magnetic element 410, the output OUT4 of the processor 412, defined by equation 5, is a substantially linear function of the offset distance OD. The sinusoidal nature of the sensor outputs is preserved for a limited distance as either end of the magnetic element 410 passes beyond a sensor axis. Thus, the output OUT4 provides a substantially linear function of the offset distance OD over a range of motion of the magnetic element 410 that exceeds the overall pole-to-pole length of the magnetic element 410.

Figure 6B:
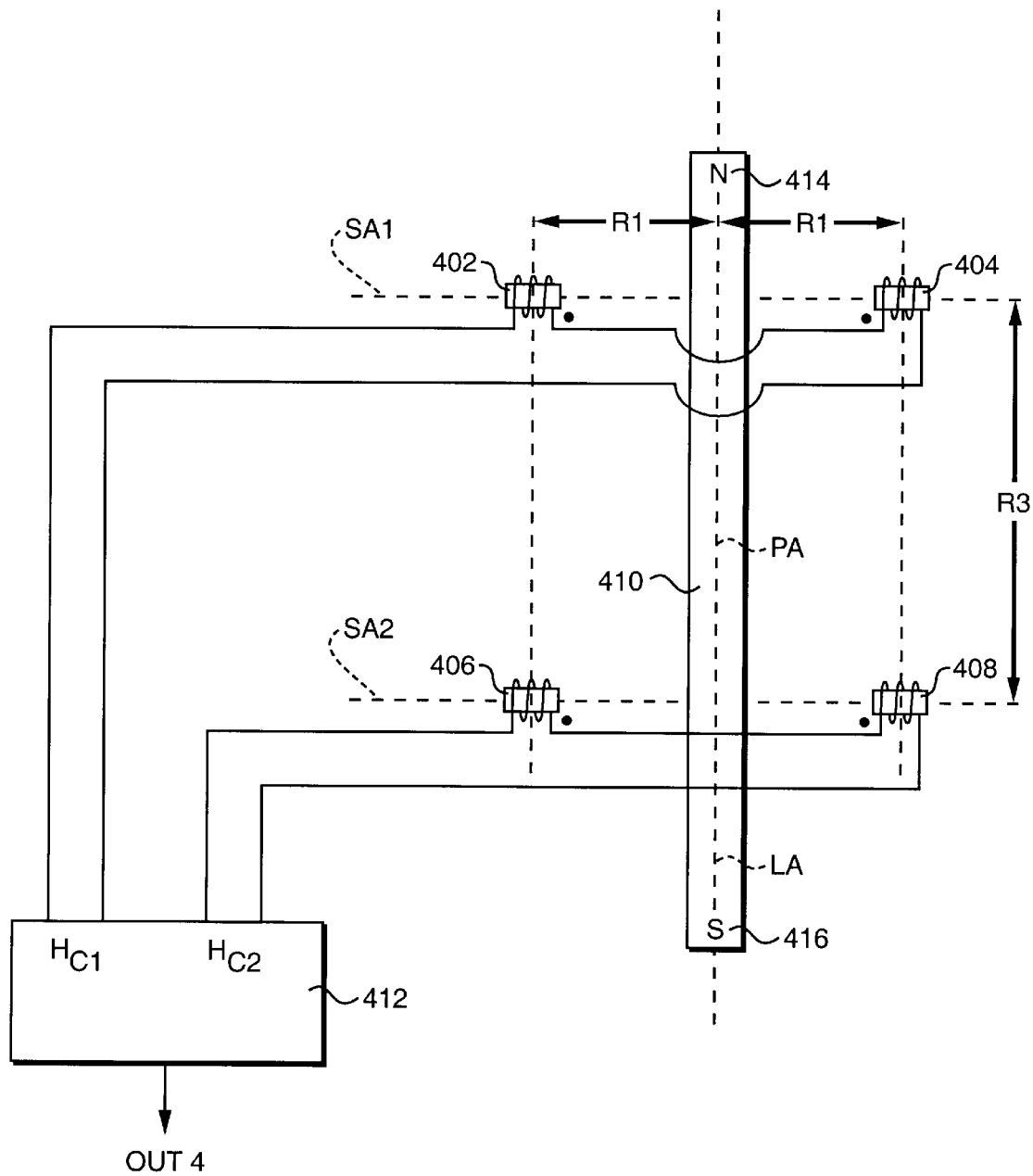
FIG. 6B illustrates a variation of the embodiment shown in FIG. 6A.

FIG. 6B illustrates a variation of the embodiment shown in FIG. 6A. In FIG. 6B, the radial sensor pair 402 and 404 are disposed on opposite sides of the magnetic element 410 at an equal distance R1. The radial sensor pair 406 and 408 are likewise disposed on opposite sides of the magnetic element 410. As described for the embodiment shown in FIG. 2B, the radial components of the field on opposite sides of the magnetic element 410 are in opposite directions, so the sensors 402 and 404 (and similarly for sensors 406 and 408), when arranged in series opposition, will add the radial components of the magnetic element 410 equally while rejecting any magnetic fields common to each sensor pair.

In the embodiments shown in FIGS. 6A and 6B, two sets of sensor pairs (first pair—402 and 404; second pair—406 and 408) provide a quadrature sampling of the radial magnetic field produced by the magnetic element 410. In alternate embodiments, a single pair of sensors (either 402 and 404, or 406 and 408) may be used to provide position information, albeit at an increased signal to noise ratio relative to the dual sensor pair configuration of FIGS. 6A and 6B.

Figure 7:
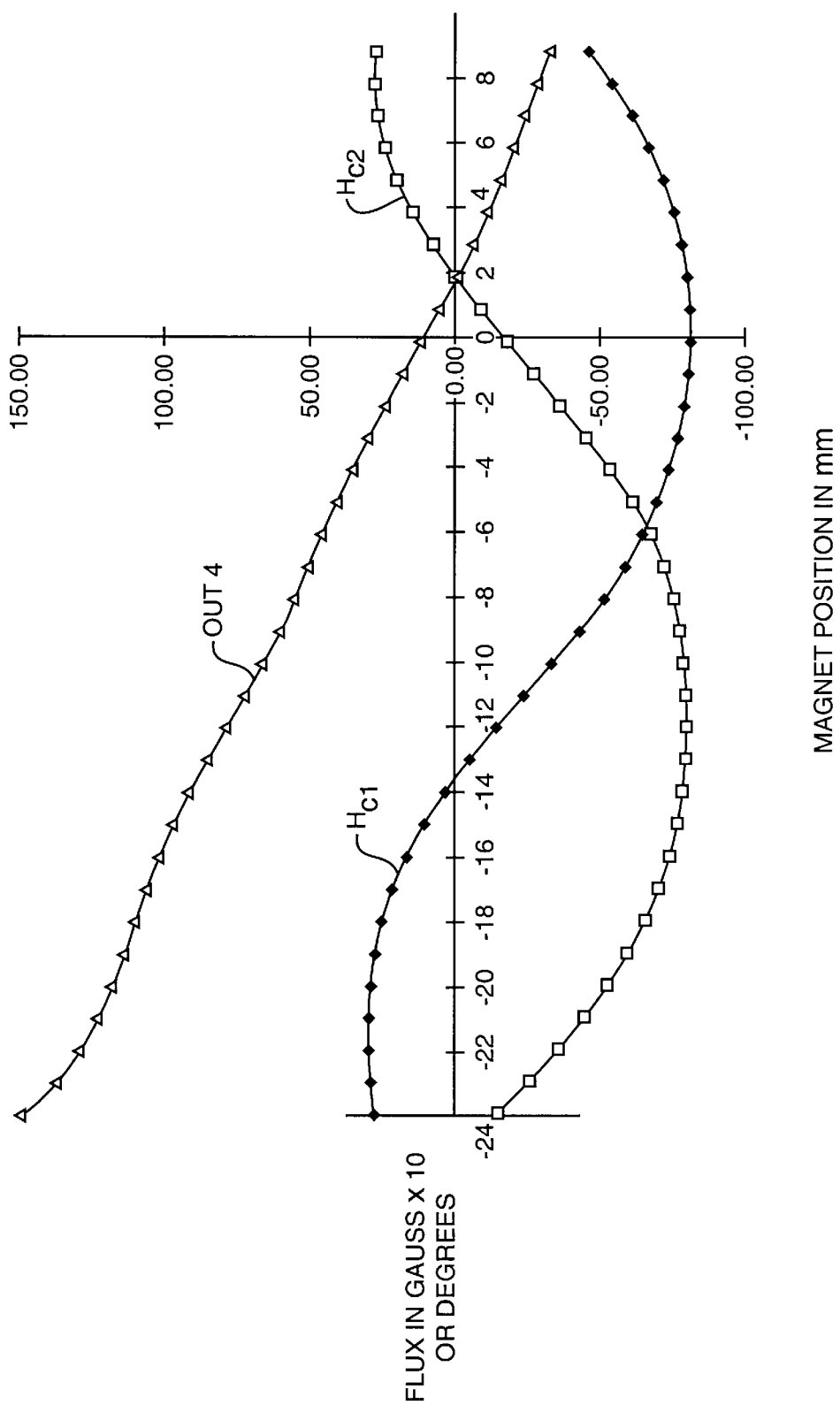
FIG. 7 illustrates the composite sensor outputs along with the processor output for an extended range linear motion position encoder.

FIG. 7 illustrates the composite sensor outputs $H_{C1}$ and $H_{C2}$ along with the processor output OUT4 for an example of this embodiment having a magnetic element with a pole-to-pole length of 24 mm, a range of motion of 33 mm, R3=12 mm, R1=12.5 mm and R2=25 mm. For this example, the RMS error of OUT4 with respect to true linear over the entire 33 mm range of movement of the magnetic element 410 is approximately 0.69% of full scale.

Figure 8:
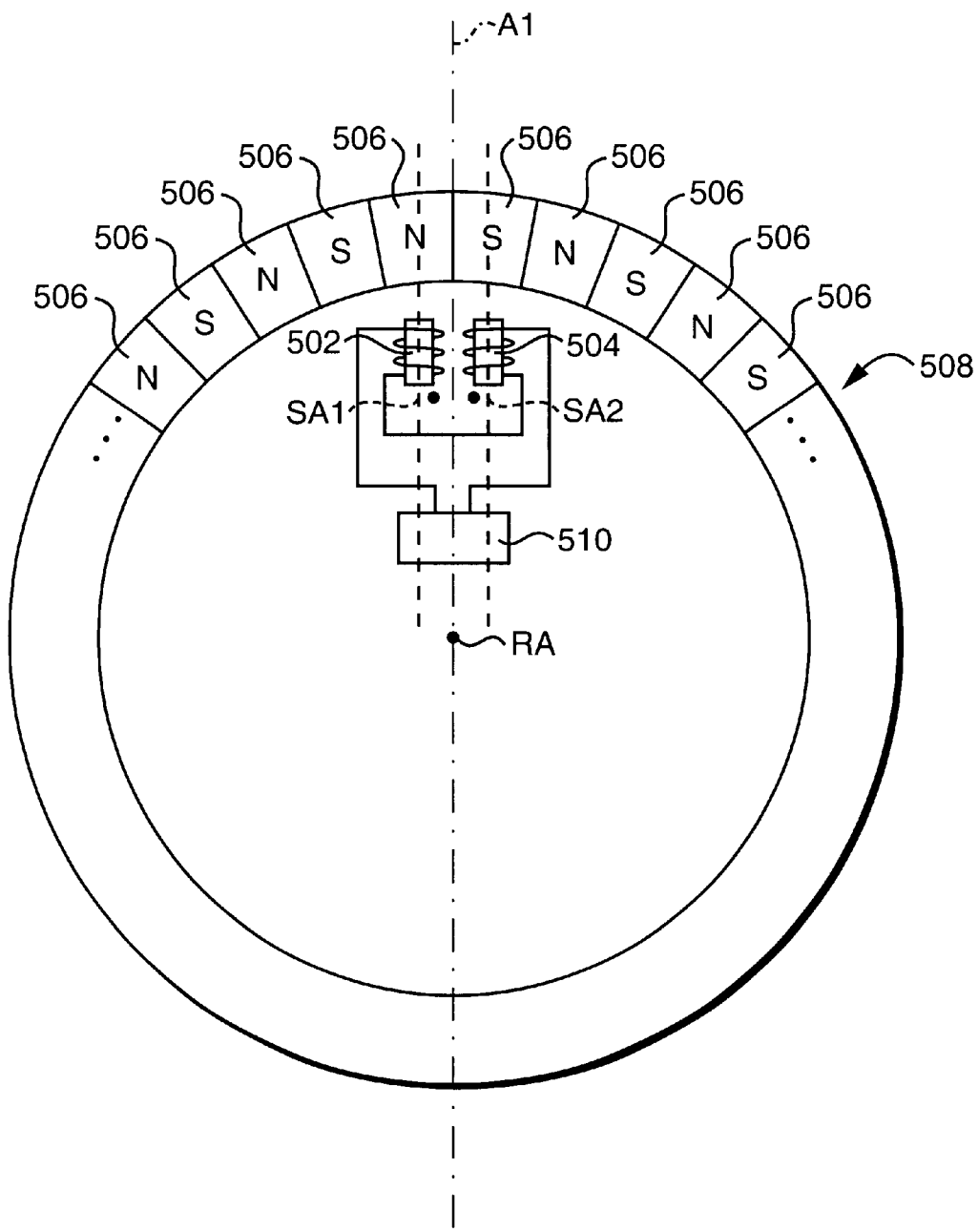
FIG. 8 illustrates a schematic view of another embodiment of the position encoder from FIG. 1.

FIG. 8 illustrates a schematic view of another embodiment of an improved position encoder according to the present invention, including a first fluxgate sensor 502, a second fluxgate sensor 504, a plurality of magnetic elements 506, a rotatably movable object 508 and a processor 510. Each of the magnetic elements 506 includes a north pole and a south pole disposed along a polar axis PA (not shown). The relative locations of the north pole and south pole along the polar axis PA define a polar orientation of each of the magnetic elements 506. The rotatably movable object 508 rotates about a rotational axis RA, normal to a reference axis A1, so as to form a mean plane of rotation. The reference axis A1 intersects the rotational axis RA and lies within the mean plane of rotation. The magnetic elements 506 are distributed about and fixedly attached to the perimeter of the rotatably movable object 508 within the mean plane of rotation, such that adjacent magnetic elements 506 alternate polar orientation. In FIG. 8, only one pole of each of the magnetic elements 506 is shown, and the alternating polar orientation is illustrated by the alternating N-S pattern.

The first flux gate sensor 502 and the second flux gate sensor 504 are disposed along a first sensor axis SA1 and a second sensor axis SA2, respectively, upon alternate sides the reference axis A1 and adjacent to the movable object 508, so as to be substantially aligned with two adjacent magnetic elements. The relative orientation between a sensor and the corresponding magnetic element when the sensor and magnetic element are aligned is preferably such that the sensor detects a maximum amount of the available magnetic field. For example, a sensor disposed along the polar axis PA of a magnetic element 506 should be oriented as a radial magnetic field sensor, because the radial component of the magnetic element will predominate over other components of the magnetic field. Other embodiments of the invention may include sensors that are otherwise imperfectly oriented with respect to the field of a corresponding magnetic element.

Figure 9A:
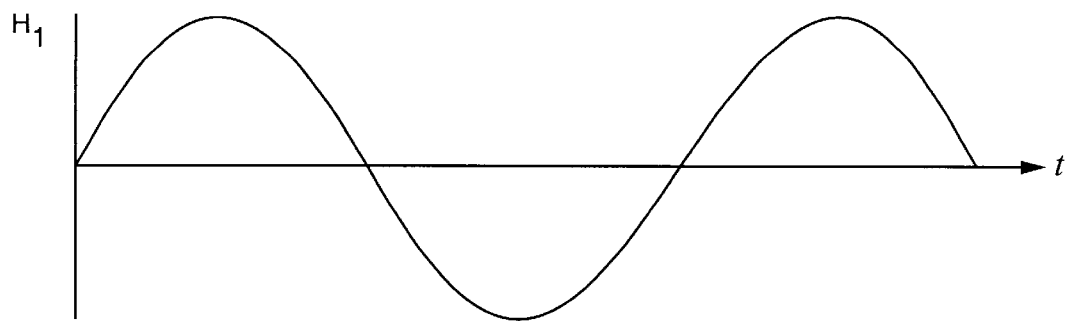
FIG. 9A graphically illustrates a sensor output from the embodiment shown in FIG. 8.
Figure 9B:
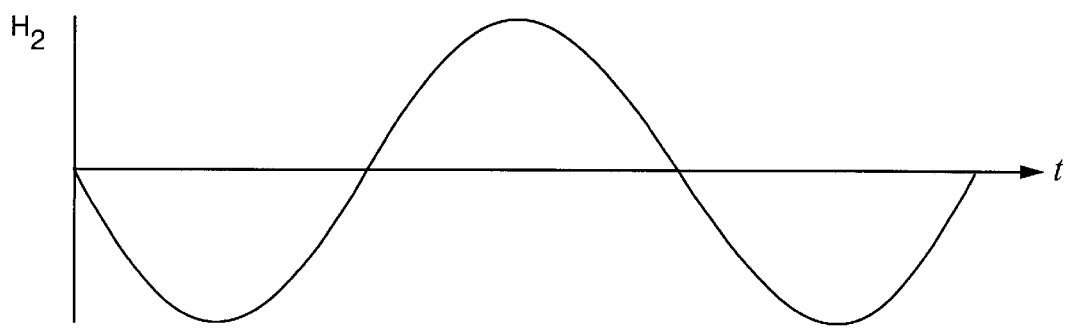
FIG. 9B graphically illustrates a sensor output from the embodiment shown in FIG. 8.
Figure 9C:
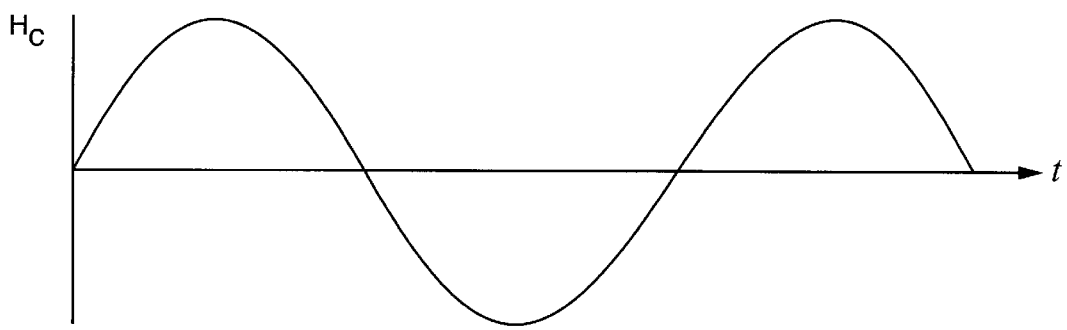
FIG. 9C graphically illustrates a sensor output from the embodiment shown in FIG. 8.

The first flux gate sensor 502, which provides a first sensor signal S1, and the second fluxgate sensor 504 which provides a second sensor signal S2, are electrically connected to one another in series opposition as shown in FIG. 8, so as to provide a composite sensor output signal $H_C = H_1 - H_2$ to the processor 510. As the rotatably movable object 508 rotates, the individual magnetic elements 506 pass by the sensors 502 and 504. FIGS. 9A, 9B and 9C illustrate the output signals $H_1$, $H_2$ and, $H_C$, respectively. The contemporaneous peaks that occur in FIGS. 9A, 9B and 9C represent the point in the rotation of the rotatably movable object 508 at which a particular sensor axis (i.e., sensor axis SA1 for FIG. 9A and sensor axis SA2 for FIG. 9B) intersects the polar axis PA of the magnetic element 506 with which it is aligned. The peaks alternate in polarity because of the alternating nature of adjacent magnetic elements 506. Since the peaks are contemporaneous and the sensors are electrically connected in series opposition, the signals from the individual sensors 502 and 504 add constructively and the composite signal $H_C$ also includes contemporaneous peaks with the same polarity as $H_1$. Using techniques well known to those in the art, the processor 510 determines dynamic rotational parameters of the object 508 from the rate at which the $H_C$ peaks and zero crossings occur, along with information regarding the spatial distribution of the magnetic elements 506. An example of an application of the embodiment shown in FIG. 8 is determining the angular velocity and acceleration of an automobile tire. In such an application, the alternating pattern of magnetic poles is disposed along the tire sidewall, and the sensors are mounted to the automobile frame, such that the tire sidewall passes substantially adjacent to the sensors as the tire rotates.

Figure 10:
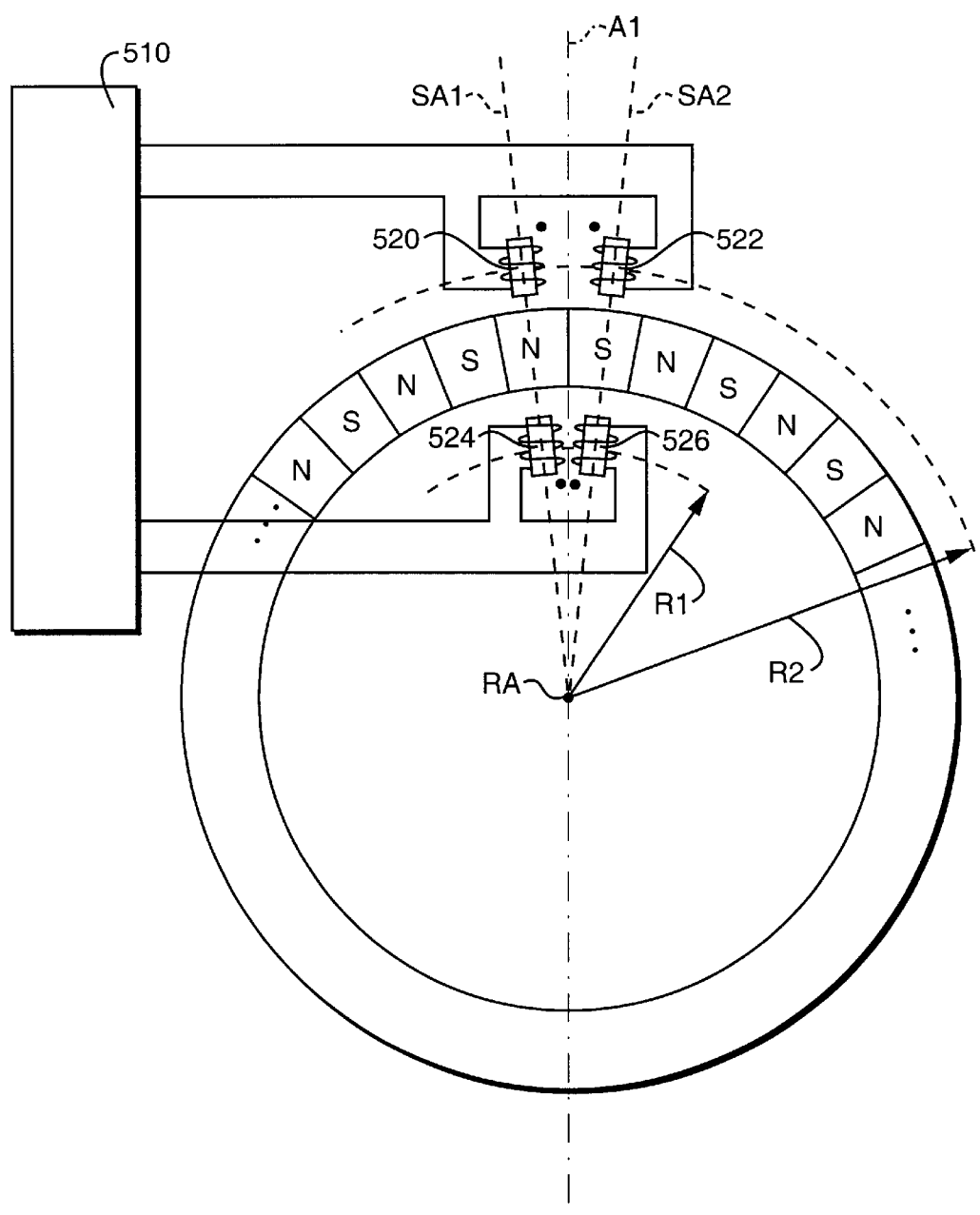
FIG. 10 shows a schematic view of a variation of the embodiment described in FIG. 8.
Figure 11:
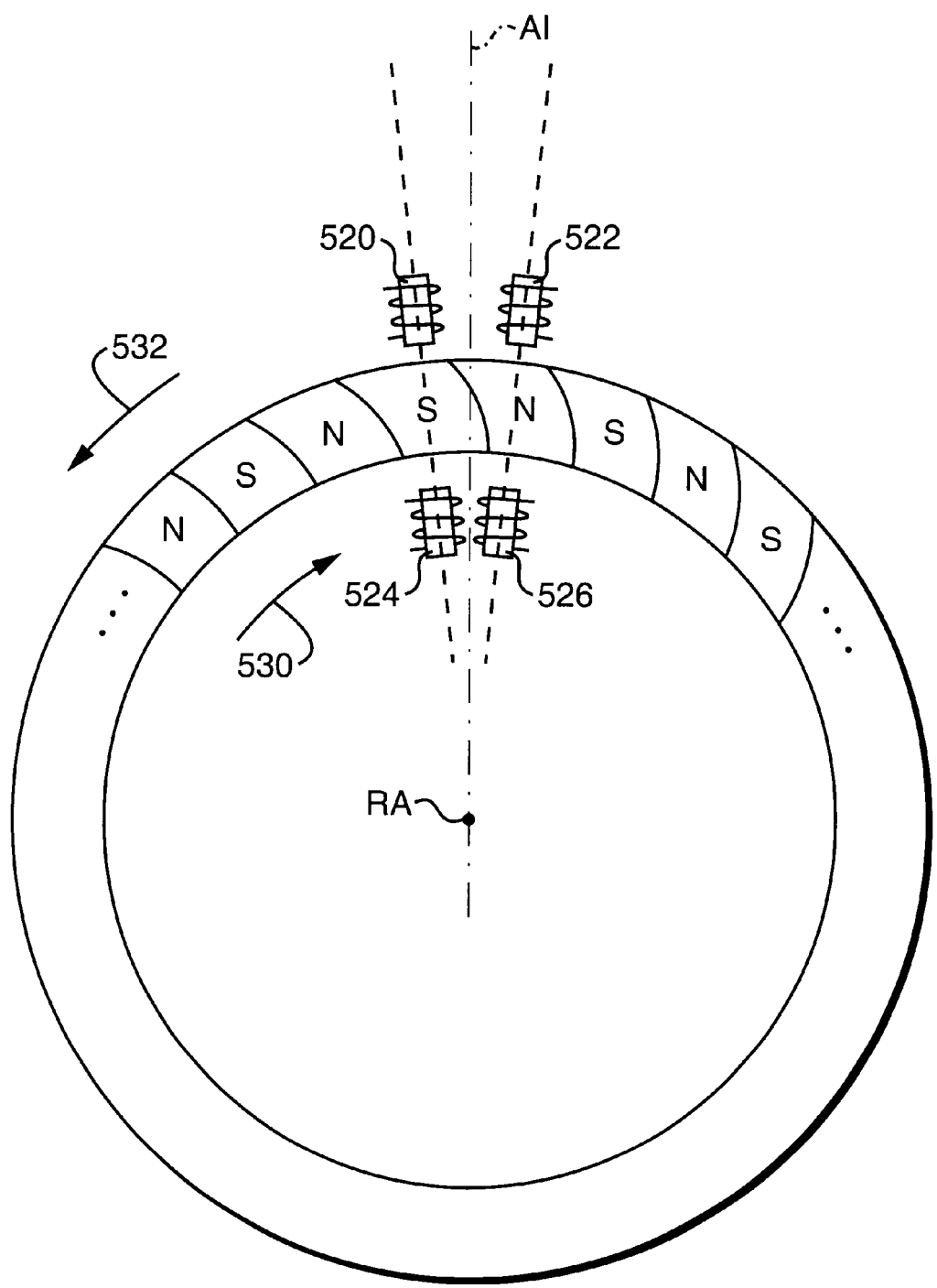
FIG. 11 illustrates a deformation of the rotatably movable body described in FIG. 8.
Figure 12:
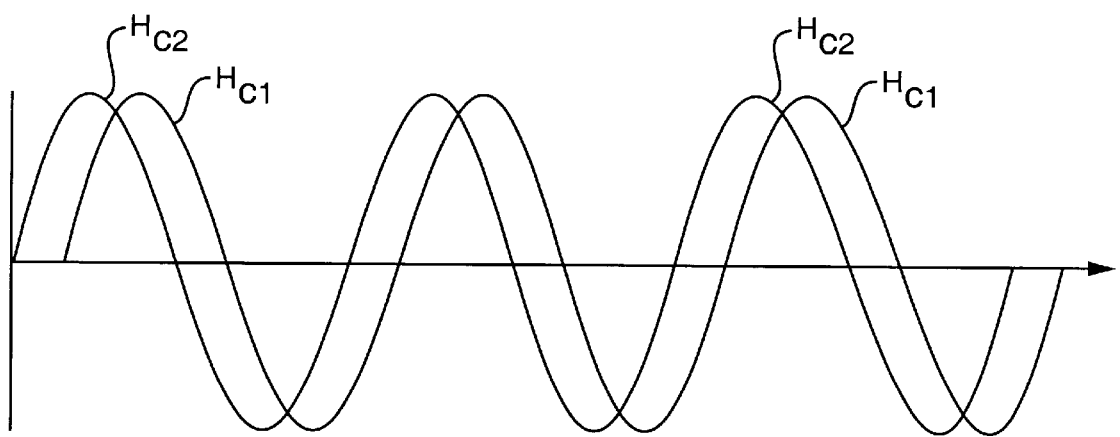
FIG. 12 graphically illustrates a phase shift of the $H_{C2}$ pulses with respect to the $H_{C1}$ pulses.

In another embodiment of the invention described in FIG. 8, a first pair of sensors 520 and 522 are distributed along sensor axes SA1 and SA2 at a first radius R1, and a second pair of sensors 524 and 526 are distributed along sensor axes SA1 and SA2 at a second radius R2, as illustrated in FIG. 10. The first pair of sensors 520 and 522 are electrically connected to one another in series opposition so as to produce a first composite signal $H_{C1}$, and the second pair of sensors 524 and 526 are electrically connected to one another in series opposition so as to produce a second composite signal $H_{C2}$. Such an arrangement allows the processor 510 to calculate the angular velocity and acceleration from either pair of sensors as with the embodiment of FIG. 8, but the embodiment of FIG. 10 further allows the calculation of specific stresses to the movable body 508 by measuring deformation in the body 508. In an automobile tire for example, acceleration or deceleration causes a torsion within the tire, resulting in a deformation as shown in FIG. 11, where the outer portion of the tire sidewall is skewed with respect to the inner portion of the sidewall, caused by an external force 532 in the direction opposite the direction of rotation 530. This skewing results in a phase shift in the $H_{C2}$ pulses with respect to the $H_{C1}$ pulses, as shown in FIG. 12. Using techniques well known to those in the art, the processor 510 analyzes the phase shift between the $H_{C2}$ pulses and the $H_{C1}$ pulses to determine the torsion present in the tire body.

Any or all of the embodiments of the position encoder described herein may further include a temperature compensation component that compensates for system parameter variations corresponding to variations in ambient temperature. Such system parameter variations may include magnetic field variations of the magnetic element, or dimensional variations (i.e., length, diameter, etc.) of the system components. Such compensation is especially necessary when the fluxgate sensors are remotely located with respect to the processor and driver circuits. Once the component temperatures are known, any one of several temperature compensation techniques known to those in the art may be used. One method of determining the component temperatures is to collocate a temperature sensing device 111 (such as a thermister, thermocouple or other temperature sensing device) with the component, as shown in FIG. 1. Another method of determining the component temperature is to utilize the fluxgate sensors. It is well known to those in the art that the resistance of an electrical conductor is directly related to the temperature of the conductor. One embodiment of a fluxgate sensor includes several hundred windings of relatively fine wire, thus a temperature variation of the fluxgate sensor corresponds to a readily measurable variation of resistance of the windings. By using known techniques to determine the resistance of the windings, the position encoder can determine the temperature of the fluxgate sensors and compensate the sensing signals (and thereby compensate the output signal) accordingly.

The invention may be embodied in other specific forms without departing from the spirit or essential characteristics thereof. The present embodiments are therefore to be considered in respects as illustrative and not restrictive, the scope of the invention being indicated by the appended claims rather than by the foregoing description, and all changes which come within the meaning and range of the equivalency of the claims are therefore intended to be embraced therein.

What is claimed is:

1. A position encoder for providing a substantially linear output signal representative of a position of a movable magnetic element, relative to a reference position, comprising:

said magnetic element having opposing magnetic poles disposed along a polar axis and producing a magnetic field;

a first spatially orthogonal fluxgate sensor pair for detecting said magnetic field, said first sensor pair including a first tangential field sensor and a first radial field sensor, and being disposed adjacent to said polar axis at a first predetermined distance and fixed with respect to said reference position, and a second spatially orthogonal fluxgate sensor pair for detecting said magnetic field, said second pair including a second tangential field sensor and a second radial field sensor, and being disposed adjacent to said polar axis at a second predetermined distance and fixed with respect to said reference position, wherein said first tangential field sensor and said second tangential field sensor are electrically connected in series opposition so as to produce a composite tangential signal, and said first radial field sensor and said second radial field sensor are electrically connected in series opposition so as to produce a composite radial signal; and, a signal processor for receiving said composite tangential signal and said composite radial signal, and for producing said output signal as a function of said said composite tangential signal and said composite radial signal.

2. A position encoder according to claim 1, wherein one of first said sensor pair is electrically connected in series opposition with one of said second sensor pair.

3. A position encoder according to claim 1, wherein said first predetermined distance is less than said second predetermined distance.

4. A position encoder according to claim 3, wherein said first predetermined distance is substantially equal to one half of said second predetermined distance.

5. A position encoder according to claim 1, wherein said position of said movable body includes angular position, said movable body includes a rotatable shaft having a rotational axis, said magnetic element defines a mean plane of rotation substantially normal to said rotational axis, and said first and second fluxgate sensor pairs are fixed relative to said reference position.

6. A position encoder according to claim 5, wherein said first sensor pair and said second sensor pair each includes a radial sensor for sensing a radial component of said magnetic field, and a tangential sensor for sensing a tangential component of said magnetic field.

7. A position encoder according to claim 6, all of said sensors being disposed along a sensor axis within said mean plane of rotation normal to said rotational axis, said tangential sensor of said first sensor pair being disposed at a distance R1, said tangential sensor of said second sensor pair being disposed at a distance R2, said radial sensor of said first sensor pair being disposed at a distance of R3, and said radial sensor of said second sensor pair being disposed at a distance of R4, wherein said distances R1, R2, R3 and R4 are chosen such that a first ratio R3/R1 is substantially equal to a first predetermined value, a second ratio R4/R2 is substantially equal to a second predetermined value, a third ratio R2/R1 is substantially equal to a third predetermined value, and a fourth ratio R4/R3 substantially equal to a fourth predetermined value.

8. A position encoder according to claim 7, wherein said first predetermined value is $2^{1/3}$, said second predetermined value is $2^{1/3}$, said third predetermined value is 2, and said fourth predetermined value is 2.

9. A position encoder according to claim 1, said position of said movable magnetic element includes rectilinear position, said movable magnetic element includes an elongated bar element disposed along an axis of motion parallel with said polar axis, and said first and second fluxgate sensor pairs are fixed relative to said reference position.

10. A position encoder according to claim 9, wherein said first sensor pair and said second sensor pair each includes a radial sensor sensing a radial component of said magnetic field, and a tangential sensor for sensing a tangential component of said magnetic field.

11. A position encoder according to claim 10, wherein said radial sensor of said first sensor pair is electrically connected in series opposition with said radial sensor of said second sensor pair, so as to produce a radial component signal, and said tangential sensor of said first sensor pair is electrically connected in series opposition to said tangential sensor of said second sensor pair, so as to produce a tangential component signal.

12. A position encoder according to claim 10, all of said sensors being disposed along an axis substantially normal to said axis of motion, said tangential sensor of said first sensor pair being disposed at a distance R1, said tangential sensor of said second sensor pair being disposed at a distance R2, said radial sensor of said first sensor pair being disposed at a distance of R3, and said radial sensor of said second sensor pair being disposed at a distance of R4, wherein said distances R1, R2, R3 and R4 are chosen such that a first ratio R3/R1 is substantially equal to a first predetermined value, a second ratio R4/R2 is substantially equal to a second predetermined value, a third ratio R2/R1 is substantially equal to a third predetermined value, and a fourth ratio R4/R3 substantially equal to a fourth predetermined value.

13. A position encoder according to claim 12, wherein said first predetermined value is $2^{1/3}$, said second predetermined value is $2^{1/3}$, said third predetermined value is 2, and said fourth predetermined value is 2.

14. A position encoder according to claim 1, further including a temperature sensing element for determining a temperature of said first and second fluxgate sensor pairs and compensating said output signal as a predetermined function of said temperature.

15. A position encoder according to claim 1, further including a temperature sensing element for determining a temperature of said magnetic element and compensating said output signal as a predetermined function of said temperature.

16. A position encoder for providing a substantially linear output signal representative of a position of a movable body, relative to a reference position, comprising:
   a plurality of magnetic elements, each having opposing magnetic poles disposed along a polar axis so as to define a polar orientation, and each of said magnetic elements producing a magnetic field, said elements being uniformly distributed about, and fixedly attached to, said movable body, such that adjacent magnetic elements alternate said polar orientation;
   a pair of fluxgate sensors substantially aligned with adjacent poles of respectively two adjacent ones of said magnetic elements, and fixed with respect to said reference position; and,
   a signal processor for receiving at least a first signal and a second signal from said pair of fluxgate sensors, said first signal representing said magnetic field from a first magnetic element of said two adjacent ones of said magnetic elements, said second signal representing said magnetic field from a second magnetic element of said two adjacent ones of said magnetic elements, and for producing said output signal corresponding to a predetermined combination of said first signal and said second signal.

17. A position encoder according to claim 16, wherein said position of said movable body includes angular position and said movable body includes a toroid having at least one sidewall and being rotatable about a rotational axis, said plurality of magnetic elements being distributed upon said sidewall.

18. A position encoder according to claim 16, said pair of fluxgate sensors being electrically connected in series opposition, so as cancel an extraneous magnetic field common to said pair of fluxgate sensors.

19. A position encoder according to claim 16, further including a second pair of fluxgate sensors substantially aligned with said two adjacent ones of said magnetic elements, at opposite poles with respect to said pair of fluxgate sensors, wherein said signal processor further receives corresponding signals from said second pair of fluxgate sensors and said output signal corresponds to a predetermined combination of said first signal, said second signal, and said signals from said second pair of fluxgate sensors.

20. A position encoder according to claim 19, said signal processor receiving at least a third signal and a fourth signal from said second pair of fluxgate sensors, wherein said signal processor further produces a second output signal corresponding to a deformation of said sidewall.

21. A position encoder for providing an output signal representative of a position of a movable body along an axis of motion, relative to a reference point, comprising:
   an elongated magnetic element having a length L and having opposing magnetic poles disposed along a polar axis and producing a magnetic field, said magnetic element being fixedly attached to said movable body;
   a first fluxgate sensor and a second fluxgate sensor disposed along a first sensor axis extending through and substantially normal to said polar axis, said first sensor being disposed at a first predetermined distance R1 from said polar axis and said second sensor being disposed at a second predetermined distance R2 from said polar axis;
   a third fluxgate sensor and a fourth fluxgate sensor disposed along a second sensor axis extending through and substantially normal to said polar axis and parallel to said first sensor axis, said third sensor being disposed at a third predetermined distance R3 from said polar axis and said fourth sensor being disposed at a fourth predetermined distance R4 from said polar axis, said first sensor axis being a predetermined distance D from said second sensor axis measured along said polar axis, wherein said distance D is substantially equal to L/3; and
   a signal processor for receiving a plurality of signals from said first, second, third and fourth fluxgate sensors, and for producing said output signal corresponding to a predetermined combination of said plurality of signals, such that said output signal is representative of said position of said movable body and said range of motion of said movable body is substantially greater than said length L.

22. A position encoder according to claim 21, wherein a ratio of R1 to R2 is substantially equal to 2, and a ratio of R3 to R4 is substantially equal to 2.

23. A position encoder according to claim 21, wherein said fluxgate sensors are oriented so as to detect a radial component of said magnetic field.

24. A position encoder according to claim 21, wherein said fluxgate sensors are oriented so as to detect a tangential component of said magnetic field.

25. A position encoder according to claim 21, wherein said first fluxgate sensor and said second fluxgate sensor are electrically connected in series opposition so as to produce a first signal for said signal processor, and said third fluxgate sensor and said fourth fluxgate sensor are electrically connected in series opposition so as to produce a second signal for said signal processor.

26. A position encoder according to claim 25, wherein said predetermined combination of said plurality of signals is the arctangent of the ratio of the first signal to the second signal.

27. A position encoder according to claim 21, wherein said first sensor and said second sensor are disposed on opposite sides of said polar axis, and said third sensor and said fourth sensor are disposed on opposite sides of said polar axis.

28. A position encoder according to claim 27, wherein the distance R1 is substantially equal to the distance R2, and the distance R3 is substantially equal to R4.

29. A position encoder according to claim 27, wherein the distances R1, R2, R3 and R4 are all substantially equal to one another.

30. A position encoder for providing an output signal representative of an angular position of a rotatably movable body having an axis of rotation, relative to a reference point, comprising:

at least one magnetic element having opposing magnetic poles disposed along a polar axis and producing a magnetic field, said at least one magnetic element being fixedly attached to said movable body, offset from said axis of rotation, such that said magnetic element rotates eccentrically with respect to said movable body;

a radial fluxgate sensor for detecting a radial component of said magnetic field, said radial sensor being disposed adjacent to said polar axis at a first predetermined distance, and a tangential fluxgate sensor for detecting a tangential component of said magnetic field, said tangential sensor being disposed adjacent to said polar axis at a second predetermined distance; and, a signal processor for receiving at least one signal from said radial sensor and at least one signal from said tangential sensor, and for producing said output signal corresponding to a predetermined combination of said at least one signal from said radial sensor and said at least one signal from said tangential sensor, such that a resulting relationship between said output signal and said position of said movable body is substantially linear for a range of said angular position.

31. A position encoder according to claim 30, wherein said predetermined combination includes summing a first signal om said radial sensor representative of said radial component and a second signal from said tangential sensor representative of said tangential component.

* * * * *

UNITED STATES PATENT AND TRADEMARK OFFICE
CERTIFICATE OF CORRECTION

PATENT NO. : 6,265,867 B1
DATED : July 24, 2001
INVENTOR(S) : J. Thomas Fowler

It is certified that error appears in the above-identified patent and that said Letters Patent is hereby corrected as shown below:

Column 15,
Line 65, delete "said", third occurrence;

Column 16,
Line 49, after "sensor", insert -- for --;

Column 20,
Line 11, delete "om" and insert therefor -- from --.

Signed and Sealed this

Twenty-eighth Day of May, 2002

Attest:

JAMES E. ROGAN
Attesting Officer
Director of the United States Patent and Trademark Office